US008383492B2

(12) United States Patent
Dross et al.

(10) Patent No.: US 8,383,492 B2
(45) Date of Patent: Feb. 26, 2013

(54) METHOD FOR THE PRODUCTION OF THIN LAYER OF SILICON BY UTILIZATION OF MISMATCH IN COEFFICIENT OF THERMAL EXPANSION BETWEEN SCREEN PRINTED METAL LAYER AND SILICON MOTHER SUBSTRATE

(75) Inventors: Frederic Dross, Schaarbeek (BE); Emmanuel Van Kerschaver, Wezemaal (BE); Guy Beaucarne, Oud-Heverlee (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 0 days.

(21) Appl. No.: 12/872,218

(22) Filed: Aug. 31, 2010

(65) Prior Publication Data

US 2010/0323472 A1    Dec. 23, 2010

Related U.S. Application Data

(63) Continuation of application No. 11/736,929, filed on Apr. 18, 2007, now Pat. No. 7,875,531.

(60) Provisional application No. 60/793,098, filed on Apr. 19, 2006.

(30) Foreign Application Priority Data

May 30, 2006 (EP) .................................... 06011050

(51) Int. Cl.
 *H01L 21/30* (2006.01)
(52) U.S. Cl. ........................................ 438/458; 438/457
(58) Field of Classification Search .................. 438/457, 438/458
 See application file for complete search history.

(56) References Cited

U.S. PATENT DOCUMENTS

| 4,582,559 A | 4/1986 | Tanielian et al. |
| 6,100,166 A * | 8/2000 | Sakaguchi et al. ............. 438/455 |
| 6,452,091 B1 * | 9/2002 | Nakagawa et al. ........... 136/261 |
| 6,770,542 B2 | 8/2004 | Plossl et al. |
| 6,802,926 B2 * | 10/2004 | Mizutani et al. .............. 156/247 |
| RE39,484 E | 2/2007 | Bruel |
| 2003/0203547 A1 * | 10/2003 | Sakaguchi et al. ............. 438/151 |
| 2005/0000564 A1 * | 1/2005 | Sato et al. ...................... 136/256 |
| 2005/0101105 A1 | 5/2005 | Ghyselen et al. |

(Continued)

FOREIGN PATENT DOCUMENTS

EP    1069602 A2    1/2001

OTHER PUBLICATIONS

Albers et al. "Solarforce is looking for investors to commercialize silicon ribbon process" © Photon International, Jun. 2004.

(Continued)

*Primary Examiner* — David Vu
*Assistant Examiner* — Caleb Henry
(74) *Attorney, Agent, or Firm* — Knobbe Martens Olson & Bear, LLP

(57) ABSTRACT

A method is provided for producing a thin substrate with a thickness below 750 microns, comprising providing a mother substrate, the mother substrate having a first main surface and a toughness; inducing a stress with predetermined stress profile in at least a portion of the mother substrate, said portion comprising the thin substrate, the induced stress being locally larger than the toughness of the mother substrate at a first depth under the main surface; such that the thin substrate is released from the mother substrate, wherein the toughness of the mother substrate at the first depth is not lowered prior to inducing the stress. The method can be used in the production of, for example, solar cells.

28 Claims, 14 Drawing Sheets

U.S. PATENT DOCUMENTS

2005/0247674 A1* 11/2005 Kubelbeck et al. ............. 216/92

OTHER PUBLICATIONS

Blakers et al., "Recent development in Sliver Cell Technology", 20th European Photovoltaic Solar Energy Conference, Jun. 6-10, 2005, Barcelona, Spain.

Brendel, R., Jpn. J. Appl. Phys. vol. 40, Part 1, No. 7, 4431 (2001).

Carnel et al. "Perspectives for a-Si/c-Si Heterojunction Solar Cells with p or n Type Base" 31$^{st}$ IEEE PVSC, pp. 1157-1160 (2005).

Janoch et al. Conference Record IEEE Photovoltaic Specialists Conference, 1997.

Koch et al., Proceedings Td World PVSEC. 1998, p. 1254.

Shao et al., Applied Physics Letters 87, 091902, 2005, and S Bengtsson—Solid-State and Integrated Circuit Technology, 1998.

Solanki et al., Phys. Stat. Sol. (a), 182 (2000) 97.

Vorobev et al. "Cleavage of thin films for X-HREM study of interface quality in heterostructures" J. Crystal Growth 210 (2000) 182-186.

Weber et al., Appl. Phys. A, A69 (1999) 195.

* cited by examiner

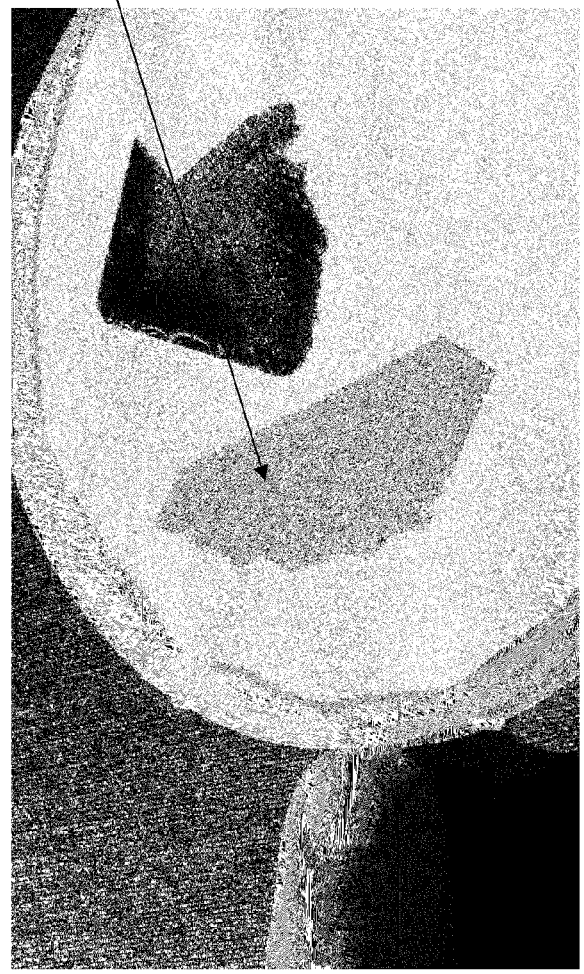
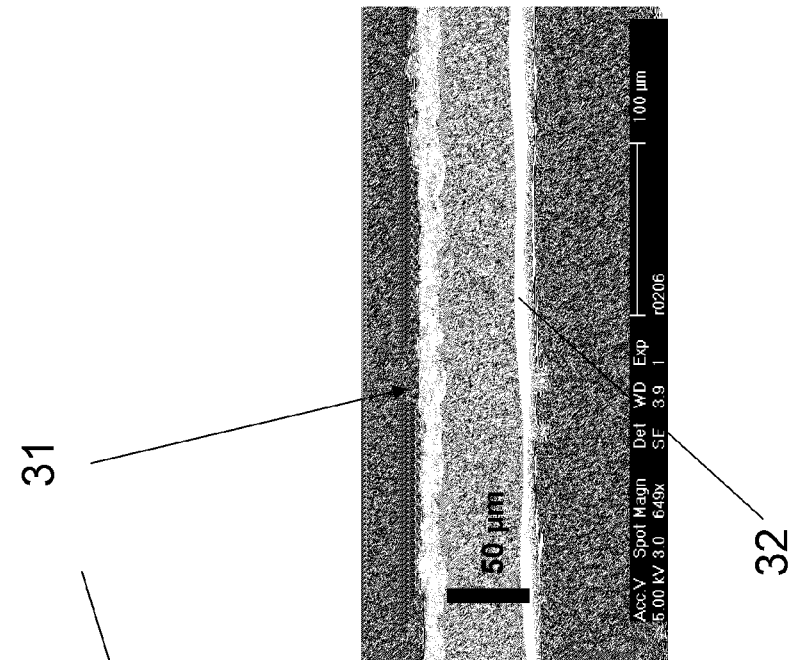
Fig. 3a
Fig. 3b

METHOD FOR THE PRODUCTION OF THIN LAYER OF SILICON BY UTILIZATION OF MISMATCH IN COEFFICIENT OF THERMAL EXPANSION BETWEEN SCREEN PRINTED METAL LAYER AND SILICON MOTHER SUBSTRATE

CROSS-REFERENCE TO RELATED APPLICATIONS

This application is a continuation of U.S. application Ser. No. 11/736,929 filed Apr. 18, 2007, which claims the benefit under 35 U.S.C. §119(e) of U.S. Provisional Application No. 60/793,098 filed Apr. 19, 2006, and claims the benefit under 35 U.S.C. §119(a)-(d) of European Application No. 06011050 filed May 30, 2006, the disclosures of which are hereby expressly incorporated by reference in their entirety and are hereby expressly made a portion of this application.

FIELD OF THE INVENTION

The present invention relates to the field of thin substrates. More particularly the present invention relates to a method for producing a thin substrate with a thickness below 750 micron. The method according to embodiments of the invention can be used in the production of, for example, solar cells.

BACKGROUND OF THE INVENTION

Nowadays' production of solar cells mainly relies on silicon. Crystalline silicon solar cells (including multi-crystalline and single-crystal) account for 90% of solar cell production [http://www.epia.org]. But a major issue is currently threatening the impressive 40% annual growth of both market and production: the world of photovoltaics is currently undergoing a deep silicon feedstock shortage [Photon International]. In addition, the price of a commercially available silicon solar module is driven by the cost of the semiconductor material which represents by itself almost half of the production cost of the finished module. Furthermore, independently of the material price, with currently industrially achievable surface recombination velocities (~200 cm·s$^{-1}$), the optimum thickness for achieving the highest efficiency on a crystalline silicon solar cell lies in the range of 50 µm, a lot thinner than the currently available 250 µm-thick wafers. Moreover below a few tens of microns, silicon becomes flexible. Encapsulated in a suitable and flexible material, it can provide a building block for new applications requiring lightweight, flexible, high efficiency solar modules, such as energy generating clothes, ambient intelligence devices, solar vehicles, etc. These arguments favor, independently of one another, the development of cells and/or wafers as thin as possible.

At the moment, silicon wafering (e.g. for solar cells) is still performed by wire saw techniques, which bring an important kerf loss of around 200 µm per wafer. The relative loss is thus even increasing for thinner substrates.

Silicon ribbon technology (W. Koch et al., Proceedings Td World PVSEC. 1998, p. 1254, Photon International, June 2004, R Janoch, R Wallace, J I Hanoka—CONFERENCE RECORD IEEE PHOTOVOLTAIC SPECIALISTS CONFERENCE, 1997), leads to the production of 150-µm-thick wafers. It is difficult to achieve thinner wafers with the conventional ribbon technologies. Moreover, the throughput of most ribbon technologies is low.

The Smart Cut technique relies on H+ implantation at a given depth in a wafer in order to weaken an underlying layer and detaching the top layer from its parent wafer. This technique is not cost competitive for solar applications [L. Shao et al., Applied Physics Letters 87, 091902, 2005, and S Bengtsson—Solid-State and Integrated Circuit Technology, 1998].

Other technologies ('lift-off' or 'layer transfer' approaches) rely on the creation of a weaker layer (crystal mismatch, porous layer, defect-full layer), on which a crystalline silicon layer is grown. The grown layer is then detached from the parent layer. [R. Brendel, Jpn. J. Appl. Phys. Vol. 40, Part 1, No. 7, 4431 (2001); C. S. Solanki, et al. (IMEC), Phys. Stat. Sol. (a), 182 (2000) 97; K. J. Weber et al., Appl. Phys. A, A69 (1999) 195].

Another alternative takes benefit of the fact that the kerf loss is reduced when a laser is used to cut the wafers. A full-laser wafering technique has not been performed yet but only thin silicon slices (1-2 mm large) have been produced, which are not ideal for solar cells because of the complexity of the assembling of the solar module. [A. W. Blakers et al., "Recent development in Sliver Cell Technology", 20th European Photovoltaic Solar Energy Conference, 6-10 Jun. 2005, Barcelona, Spain].

SUMMARY OF THE INVENTION

A good method is provided for producing a thin substrate, i.e. a substrate with a thickness below 750 µm. A composite stack of layers suitable for being used in parabolic mirrors is also provided.

In a first aspect, a method is provided for producing a thin substrate with a thickness below 750 µm. The method comprises: providing a mother substrate having a main surface and a toughness; inducing a stress with a predetermined stress profile in at least a portion of the mother substrate, the portion comprising the thin substrate, the induced stress being locally larger than the toughness of the mother substrate at a first depth under the main surface of the mother substrate; such that the thin substrate is released from the mother substrate, wherein the toughness of the mother substrate at the first depth is not lowered prior to inducing the stress. This in particular means that no weakening layer is provided at the first depth below the main surface.

According to embodiments, the method may comprise: providing a mother substrate having a main surface and a toughness; inducing a stress with a predetermined stress profile in at least a portion of the mother substrate, the portion comprising the thin substrate, the induced stress being locally larger than the toughness of the mother substrate at a first depth under the main surface of the mother substrate; such that the thin substrate is released from the mother substrate, providing at least one local weakness, e.g. a weak layer or a crack, at a second depth under the main surface of the mother substrate, the second depth being different from the first depth, wherein release of the thin substrate is performed at the first depth different from the location of the at least one local weakness.

The toughness of a material is a measure of the resistance to fracture when stressed. Toughness is the value of the stress intensity at which fracture occurs in the case of cracks, as defined in the book "The practical use of fracture mechanics", David Broek, Kluwer Academic Publishers 1988.

The mother substrate, further simply called substrate (as contrary to what is called the "thin substrate", which is that part of the mother substrate which according to the preferred embodiments is lift off), can be a bulk or homogeneous substrate. In embodiments, the substrate does not comprise local weaknesses when or prior to inducing a predetermined amount of stress for release of the thin substrate. In certain embodiments, no weakened planes are created in the substrate before inducing a predetermined amount of stress (e.g. no ion implantation, no porous layer, no crystalline mismatch).

The mother substrate can be made of any suitable material. In preferred embodiments, substrate materials can be semiconductor materials which can include, but are not limited to the following: Silicon (Si), Germanium (Ge), Gallium Phosphide (GaP), Gallium Arsenide (GaAs), Indium Arsenide (InAs), Diamond (C), Gallium Antimonide (GaSb), Indium Antimonide (InSb), Indium Phosphide (InP), Gallium Arsenide Antimonide ($GaAs_{1-x}Sb_x$), Aluminum Gallium Arsenide ($Al_xGa_{1-x}As$), Gallium Indium Phosphide ($Ga_xIn_{1-x}P$), Gallium Indium Arsenide ($Ga_xIn_{1-x}As$), Gallium Indium Antimonide ($Ga_xIn_{1-x}Sb$), Indium Arsenide Antimonide ($InAs_{1-x}Sb_x$), Gallium Indium Arsenide Phosphide ($Ga_xIn_{1-x}As_yP_{1-y}$), Gallium Indium Arsenide Antimonide ($Ga_xIn_{1-x}As_ySb_{1-y}$), Gallium Nitride (GaN), Aluminum Nitride (AlN), Indium Nitride (InN), wherein x and y are real numbers within the range [0,1]. Preferably, the semiconductor material may comprise a typical solar cell material such as Si, Ge, or GaAs. More preferably, the semiconductor material may comprise a single elemental semiconductor material such as Si, Ge, or C. Most preferably it is Silicon.

According to preferred embodiments, the first depth or the depth at which the thin substrate is lift off from the mother substrate, and hence the thickness of the thin substrate, may be determined by tuning properties and/or dimensions of a stress inducing mechanism.

According to embodiments, the stress inducing mechanism may be formed by a cylinder-shaped apparatus, e.g. roller, which is bonded to the main surface of the mother substrate. According to these embodiments, tuning properties and/or dimensions of the stress inducing mechanism may comprise tuning properties and/or dimensions of the cylinder-shaped apparatus, e.g. roller.

According to other embodiments, the stress inducing mechanism may be formed by: providing a set of at least one layer of stress induction material with a set of at least one predetermined stress induction mechanism on the mother substrate, and actuating the set of at least one stress induction mechanism.

According to these embodiments tuning the properties and/or dimensions of the stress inducing mechanism may comprise tuning properties and/or dimensions of the stress induction material. A stress induction material is a material which, when properly applied onto the mother substrate and properly actuated, has the capability to induce stress into the mother substrate.

According to preferred embodiments, a stress inducing mechanism may for example be a mechanism which induces stress under pre-determined temperature conditions, under pre-determined chemical conditions, under pre-determined pressure conditions, under pre-determined electromagnetic (for instance UV) exposure, under pre-determined electrostatic or magnetostatic field exposure, or under pre-determined atmosphere environmental conditions. With "pre-determined conditions" in this paragraph are meant these conditions at which a stress induction mechanism will be activated so as to induce stress into the mother substrate.

According to preferred embodiments, a set comprising a plurality of layers of stress induction materials may be provided and the method may furthermore comprise producing by any suitable layer-providing method, e.g. by means of screen printing, spinning, depositing, growing, evaporation, depositing, bonding, or sputtering, a stack of the layers of stress induction material onto the main surface of the mother substrate.

Providing a set of at least one layer of stress induction material may advantageously be performed under predetermined layer provision conditions. Such predetermined layer provision conditions can be chosen as conditions in which the released thin substrate will typically be used. The parameters defining these layer provision conditions can be, but are not limited to, temperature, pressure, electromagnetic (for instance UV) exposure, electrostatic or magnetostatic field exposure, atmosphere environment.

Advantageously a predetermined layer provision condition can be room temperature and/or atmospheric pressure. Moreover it can relate to environmental conditions as limited electromagnetic (e.g. UV) exposure, limited electrostatic or magnetostatic field exposure, ambient atmosphere environment.

The stress can be induced by varying at least one of the parameters which determine the predetermined layer provision conditions. For example, if the at least one layer of stress induction material is provided under ambient conditions (typically, but not only, room temperature and atmospheric pressure), after releasing and placing the thin substrate in these ambient conditions, the shape of the thin substrate is likely to reproduce the shape of the main surface of the mother substrate and is therefore easily controllable.

The at least one stress inducing mechanism can be actuated sequentially or contemporarily.

In preferred embodiments, the bond between two following or adjacent layers of the set of stress induction materials and between a first layer of stress induction material of the set of stress induction materials and the mother substrate may be strong enough to withstand the induced mechanical stress.

In preferred embodiments, the at least one layer of stress induction material may be able to withstand the stress without breaking. In embodiments, the at least one layer of stress induction material may be able to withstand the stress without plastic deformation.

In preferred embodiments, the at least one layer of stress induction material may, on itself, be flexible. At least locally curling of the at least one layer of stress induction material may favor the propagation of a crack generated in the mother substrate by inducing the stress, and may favor this propagation in a direction parallel to the main surface of the mother substrate.

In preferred embodiments, the stress may be induced by creating a different expansion or contraction of the at least one layer of stress induction material with respect to the mother substrate, the expansion or contraction of the stack of layers being respectively smaller or larger than the expansion or contraction of the mother substrate. In preferred embodiments this condition may be fulfilled at least for the layer of stress induction material which is in physical contact with the mother substrate, also referred to as bottom layer, which can be a contact layer or support layer (see further). In preferred embodiments the bottom layer may be a metal layer. It can, for example, be a Li, Na, K, Rb, Cs, Be, Mg, Ca, Sr, Ba, Sc, Y, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, Hg, Al, Ga, In, Ti, Sn, Pb, Bi layer, preferably a Zn, Fe, Ag, Al, Pb, Au, Cu, Ti, Pd layer, since the latest are among the most common metals. The bottom layer may preferably be an Ag layer because the mechanical properties such as strength, young modulus, elasticity, yield point, of Ag can be favorable for releasing the thin substrate. The thermal expansion coefficient (TEC) mismatch between the mother substrate and the bottom layer can be larger than 0, preferably larger than 0.5, 1, 2, 3, 4($\times 10^{-6} K^{-1}$), advantageously larger than 5, 10, 15 ($\times 10^{-6} K^{-1}$).

According to preferred embodiments, stress may be induced by a change in dimension of the at least one layer of stress induction material in a plane of an interface between the mother substrate and the at least one layer of stress induction material.

At least one layer of the at least one layer of stress induction material can be a polymer. At least one layer of the at least one layer of stress induction material can be a thermosetting polymer which provides the advantage of being easy to be deposited, e.g. by spin coating or screen-printing, and easy to be cured, e.g. thermally or under UV exposure. At least one layer of the at least one layer of stress induction material can be a polymer with a different thermal expansion coefficient than the mother substrate, e.g. silicon, such as e.g. SU-8 photoresist. The TEC mismatch between the at least one layer of stress induction material and the mother substrate can be larger than 0, preferably larger than 0.5, 1, 2, 3, 4, advantageously larger than 5, 10, 15 ($\times 10^{-6} K^{-1}$).

In advantageous embodiments, the at least one layer of stress induction material may at least partially be cooled. Preferably, cooling may be done via the top layer, i.e. including cooling of the top layer. With top layer is meant the layer of the at least one layer of stress induction material furthest away from the mother substrate.

In embodiments, the mother substrate may be heated. A non-homogenous thermal treatment can favor the expansion or contraction difference between the mother substrate and the at least one layer of stress induction material.

In preferred embodiments, the at least one layer of stress induction material may have a first thermal expansion coefficient (TEC), and the mother substrate may have a second thermal expansion coefficient, the first TEC being larger than the second TEC. In the method, a general temperature step may be applied for inducing the stress in a least a portion of said mother substrate, the temperature step being negative (decrease in temperature).

In preferred embodiments, the at least one layer of stress induction material may have a first thermal expansion coefficient (TEC), and the mother substrate may have a second thermal expansion coefficient, the first TEC being smaller than the second TEC. In the method, a general temperature step may be applied for inducing the stress in at least a portion of said mother substrate, the temperature step being positive (increase in temperature).

In preferred embodiments, the at least one layer of stress induction materials may comprise two layers of stress induction materials. These two layers can, for example, both be metal layers. These layers can, for example, be chosen and arranged such that a bimetal effect is achieved when applying a temperature step. In preferred embodiments, for example, a bottom layer or first layer of the set of at least one layer of stress induction material may comprise Ag and a second layer of the set of at least one layer of stress induction material, on top of the first layer, may comprise Al.

The thermal expansion coefficients of Si (mother substrate), Ag and Al (stress induction materials) are respectively about $4.6 \times 10^{-6} K^{-1}$, $20 \times 10^{-6} K^{-1}$, $24 \times 10^{-6} K^{-1}$.

In preferred embodiments the set of at least one layer of stress induction material may comprise at least one piezoelectric layer and the set of stress inducing mechanisms may comprise applying a DC voltage over the at least one piezoelectric layer.

Other actuation mechanisms may, according to preferred embodiments, also be possible. Examples may be, but are not limited to, any change from the previously defined predetermined, typically ambient, conditions.

The mother substrate can be, but is not limited to, a wafer, a brick or a block. The mother substrate may have a cylindrical shape. The mother substrate may be an ingot.

In embodiments according to the preferred embodiments the mother substrate may comprise an amorphous material or can be crystalline material. The mother substrate may, for example, comprise or consist of a nano-crystalline, micro-crystalline, polycrystalline, multi-crystalline or mono-crystalline material. Crystals are referred to herein based on their grain sizes, as provided in Table 1. The term "crystalline silicon" refers to silicon of all crystal types. Materials with grain sizes bigger than the thickness of the thin substrate released can be advantageous for solar cell applications because they reduce the density of grain boundaries which are known to be recombination centers. Materials with grain sizes smaller than the dimension of the main surface of the substrate can be advantageous for solar cell applications since they are less expensive than materials with bigger grains, and since the diminution in performances for solar cells obtained on these materials can be limited compared to the diminution of the cost.

TABLE 1

Grain size for different materials which can be used for the mother substrate

| Grain size of silicon crystal | Name |
|---|---|
| Atomic size | Amorphous |
| <10 nm | Nanocrystalline |
| <0.1 μm | Micro crystalline |
| <100 μm | Polycrystalline |
| <10 cm | Multi crystalline |
| >10 cm | Mono crystalline |

In preferred embodiments the main surface of the mother substrate may be flat. The main surface of the mother substrate can be concave shaped. A concave shaped main surface can favor the release of the thin substrate. Alternatively the main surface can be convex-shaped. A substrate with a predetermined or tailored convex shape can lead to the release of a flat subsystem (comprising the thin substrate under stress and if present stress-inducing layers—see further). According to preferred embodiments, the main surface of the mother substrate can be texturized or not.

In certain preferred embodiments, the mother substrate can be chosen such that it is bent or elastically deformed when inducing the stress in at least a portion of the mother substrate.

This can be achieved by providing a mother substrate with a predetermined thickness which is low enough. For typical materials, such as e.g. silicon, the thickness of the mother substrate may be preferably smaller than 300, 200, 100 μm. In this case, the thickness of the produced thin substrate may be between 10 μm and 100 μm.

Providing a mother substrate that is bent or elastically deformed when inducing the stress can favor the release of the thin substrate.

In other preferred embodiments the mother substrate may be chosen such that it is essentially not bent or deformed when inducing the stress in at least a portion of the mother substrate.

This may be achieved by providing a mother substrate with a predetermined thickness which is high enough. For typical materials such as e.g. silicon the thickness of the mother substrate may be preferably larger than 100, 200, 300, 400, 500, 600, 750 μm, 1 mm, 1 cm, 10 cm.

Providing a mother substrate that is not significantly bent or elastically deformed when inducing the stress can favor the conservation of the integrity of the mother substrate after the release of the thin substrate and the use of the mother substrate several times for successive thin substrate releases. The mother substrate can for example be an ingot, and the so-called thin substrate can be a typical substrate for semiconductor processing, such as a substrate having a thickness not higher than 750 µm, e.g. a 600 or 750 µm thick substrate.

The thin substrate can have a thickness below 750, 600, 500, 400, 300, 200, 150, 100, 90, 80, 70, 60, 50, 40, 30, 20, or 10 µm, depending on the thickness of the mother substrate. The thin substrate can have a thickness larger than 10 nm, 100 nm, 1 µm, 5 µm. Thin substrates below 300, 200, 150, 100, 90, 80, 70, 60, 50, 40, 30, 20, or 10 µm may particularly be interesting to be obtained by this method since the standard method for obtaining such thin substrates is wire sawing, which induces a kerf loss in the range of 200 µm lost for one wafer sawn. In addition, for photovoltaic applications such as solar cell applications, it may be interesting to obtain thin substrates thinner than what is currently available. The price of a commercially available silicon solar module is driven by the cost of the semiconductor material which represents by itself almost half of the production cost of the finished module. Furthermore, independently of the material price, with currently industrially achievable surface recombination velocities (~200 cm·s$^{-1}$), the optimum thickness for achieving the highest efficiency on a crystalline silicon solar cell is usually considered to be below 100 µm, for example 50 microns, which is a lot thinner than the currently available 250 µm-thick wafers. Moreover, below a few tens of µm, silicon proves to become flexible. Encapsulated in a suitable and flexible material, it can provide a building block for new applications requiring lightweight, flexible, high efficiency solar modules, such as energy generating clothes, ambient intelligence devices, solar vehicles, etc.

The thin substrate may have a thickness higher than 10 nm, more preferably above 100 nm, 1 micron, 5, 10, 20, 30, 40, 50, 60, 70, 80, 90, or 100 µm and lower than 750 µm. The thin substrate is more resistant to breakage by manipulation, and thus easier to process than a free standing substrate if it is thicker. For thin substrates thinner than 10 µm, it can be preferable to attach them to a carrier substrate while processing them.

In preferred embodiments the induced stress may be tensile stress. In preferred embodiments the induced stress may be at least locally tensile. With "locally" is meant in the region where the crack should occur for releasing the thin substrate from the mother substrate. In preferred embodiments the induced stress may be locally mainly shear stress. In preferred embodiments the induced stress may be at least locally a combination of tensile and shear stress.

In preferred embodiments the stress may be applied such that its direction evolves towards a direction which does not coincide with any crystal plane of the mother substrate, during the release.

In preferred embodiments the stress may be applied such that its direction evolves towards a direction which coincides with a predetermined crystal plane of the mother substrate.

In preferred embodiments the stress may be applied such that the direction of the crack generated in the mother substrate by applying the stress evolves towards a direction essentially parallel to the main surface of the mother substrate. For processing the thin substrate into a solar cell, the thin substrate may preferably have a flat shape.

In advantageous preferred embodiments the released thin substrate may not completely be relieved from the exerted stress when being released, resulting in a curling of the released thin substrate. At least local curling of the released thin substrate may favor the propagation of the crack in a direction parallel to the main surface. It is believed that a curled thin substrate can be used in specific applications for which this shape can be preferable such as e.g. at the focus of a parabolic mirror for concentrated photovoltaics applications.

In preferred embodiments, the method may furthermore comprise, before inducing the stress, producing at least one local weakness at a second depth under the main surface of the mother substrate, the second depth being different from the first depth at which the thin substrate is to be released from the mother substrate. Such local weaknesses may, for example, be applied at predetermined locations in the mother substrate. For example, local weaknesses in the substrate may later serve for removing part of the thin substrate during processing of e.g. a device on the thin substrate. As an example, it is advantageous to provide as a weakening layer a layer that can be easily etched or removed, and to provide such weakening layer just below the stress-inducing layers (e.g. SiO is removed easily in HF). This can advantageously help cleaning off the stress-inducing layer after the lift-off process. Cracks may for example be provided at the first depth and before inducing the stress, so as to predetermine the thickness of the thin substrate. The at least one local weakness may, for example, be produced by, but not limited thereto, a laser, by etching or by sawing, by scratching or by cutting. The at least one local weakness can be provided on the first main surface. The mother substrate can also have a second main surface, typically substantially parallel with the first main surface and connected with the first main surface by a side surface, and the cracks can be provided on a side surface of the mother substrate.

In preferred embodiments, the mother substrate may have a side surface and the at least one layer of stress induction materials may be partially extending on the side surface of the mother substrate.

In preferred embodiments, the method may furthermore comprise temporarily bonding the at least one layer of stress induction materials to a stretchable carrier substrate. The stretchable carrier substrate can be chosen such that it is resistant to the series of stress induction mechanisms, and/or to the induced mechanical stress. The stretchable carrier substrate can be used to externally assist the stress application or induction to release the thin substrate. Alternatively, the at least one layer of stress induction material may in itself be a stretchable carrier substrate.

In preferred embodiments, at least a portion of the at least one layer of stress induction material may be removed at predetermined locations, after release of the thin substrate from the mother substrate, hereby at least partly releasing the stress from the thin substrate.

In preferred embodiments, the removed portion of the at least one layer of stress induction material may correspond to a grid pattern or other pattern which allows releasing of at least part of the stress from the at least one layer of stress induction material and thin substrate.

The remaining portion of the at least one layer of stress induction material can be predetermined or chosen in beforehand to not significantly contribute to the stress induced in the mother substrate. Its role can be limited to supporting the thin substrate while the stress has been released or to allow easy removal of the stress-induction layer from the thin substrate, e.g. in case of a SiO layer being present in between a Si mother substrate and the at least one stress-induction layer, which SiO layer can easily be removed in HF. The remaining portion of the at least one layer of stress induction material may be the difference between the at least one layer of stress induction material and the removed portion.

The remaining portion of the at least one layer of stress induction material can be predetermined or chosen in beforehand to be completely or at least partially transparent to a predetermined radiation spectrum, as for instance the solar spectrum. The remaining portion can then for example serve as a front surface of a photovoltaic device.

The remaining portion of the at least one layer of stress induction material can be chosen in beforehand to be conductive and/or provide a good electrical contact with the thin substrate. The good electrical contact of the remaining portion may be created when actuating or driving a stress induction mechanism, as for instance when applying a temperature step.

The removed portion of the set of at least one layer of stress induction material can, when the set comprises a plurality of layers, comprise only some of the layers of stress induction material. It can be a certain number of upper layers of the stack. It can comprise a number of layers which includes the lastly produced layer, i.e. the top layer of the stack. It can comprise the top layer of the stack and one or more layers of the stack underlying the top layer, which can be adjacent or in physical contact. It can be a certain number of upper layers of the stack plus a portion of the remaining stack of layers. The remaining layers of stress induction material can comprise the bottom layer, being the firstly produced layer of the plurality of layers of stress induction material.

In a further aspect, a method for producing a thin substrate with a thickness below 750 microns is provided, the method comprising: providing a mother substrate, said mother substrate having a first main surface; inducing a predetermined amount of stress in at least a portion of said mother substrate, said portion comprising said thin substrate, said induced stress being locally larger than the toughness of said mother substrate; such that said thin substrate is released from said mother substrate, wherein inducing a predetermined amount of stress is performed by: selecting a set of at least one stress induction material and a set of at least one predetermined stress induction mechanism, producing said set of at least one stress induction material on said mother substrate, and actuating said set of at least one stress inducing mechanism.

In embodiments of this aspect, the mother substrate does not comprise local weaknesses when inducing the predetermined amount of stress.

In alternative embodiments of this aspect, the mother substrate is provided with a local weakness when inducing said predetermined amount of stress.

The set of at least one stress inducing material may be provided as a stack. The stack may comprise one or more layers of stress inducing material. The stack may furthermore comprise other layers, which may enable easy removal and cleaning of the thin substrate, as set out above with respect to other aspects.

The stack of layers may have a first thermal expansion coefficient and the mother substrate may have a second thermal expansion coefficient, the first thermal expansion coefficient being different, e.g. larger, than the second thermal expansion coefficient. The method may then furthermore comprise applying a general temperature step for inducing the predetermined amount of stress in at least a portion of the mother substrate, said temperature step being negative (cooling down).

Alternatively, the stack of layers may have a first thermal expansion coefficient and the mother substrate may have a second thermal expansion coefficient, the first thermal expansion coefficient being different, e.g. smaller, than the second thermal expansion coefficient. The method may then furthermore comprise applying a general temperature step for inducing the predetermined amount of stress in at least a portion of the mother substrate, said temperature step being positive (heating up).

The stress may be induced in said mother substrate by creating a different expansion or contraction of said set of at least one stress induction material and said mother substrate.

Details of the other aspects may be combined with the present aspect.

In a further aspect, a method for repetitively producing a thin substrate of material is disclosed, comprising a repetition of the methods according to any of the previously described embodiments. A repetitive production of thin substrates from the same parent wafer or mother substrate allows the production of thin substrates with limited kerf loss, and thus is expected to strongly reduce the cost of production of such thin substrates.

The thin substrates produced by the methods according to the previously described preferred embodiments can be advantageously used for solar cell production. Both main surfaces of the thin layer or thin substrate can advantageously be used as a front surface of a solar cell, i.e. as surface to be illuminated during use of the solar cell. The surfaces present some roughness which can advantageously be used to trap light in the thin device. Such a solar cell production process can be one of the following: diffusion of an emitter, shadow evaporation of contacts, annealing, anti-reflection-coating deposition; diffusion of an emitter, $SiN_x$ deposition, contact definition by patterning a photoresist, evaporation and lift-off of the exceeding metal parts, annealing; or deposition of a doped a-Si emitter, deposition of a conductive oxide layer, contact shadow evaporation, annealing.

In a further aspect, a composite stack of layers is disclosed, comprising a thin substrate of material, e.g. semiconductor material, the layer of material having a thickness smaller than 750 μm, preferably smaller than 100 microns, more preferably smaller than 50 microns and larger than 100 nm, and at least one layer of a stress inducing material attached to the layer of material. According to the second aspect, the composite stack of layers is rolled up. It can for example be rolled up with at least a quarter, at least a half or at least one full winding. Intermediate degrees of winding are of course also possible, depending on the materials used and the stress remaining.

The preferred embodiments furthermore provide the use of the composite stack of layers according to preferred embodiments in a parabolic mirror.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the preferred embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 3a shows a picture of a thin silicon substrate after metal etching and FIG. 3b shows a microscope picture of a cross-section of a thin silicon substrate.

Figure 1:
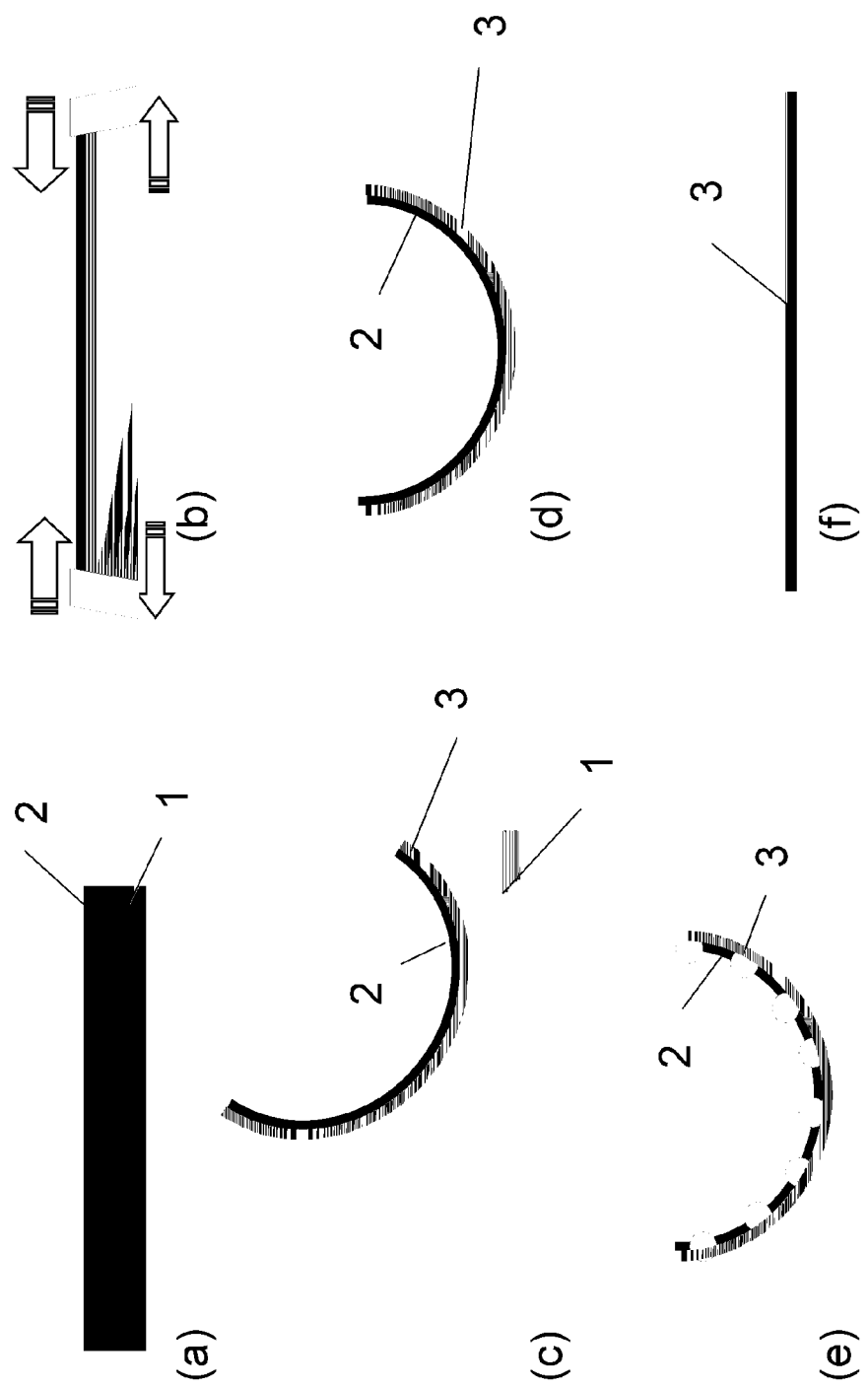
FIG. 1 illustrates a method according to a preferred embodiment.

In the different figures, the same reference signs refer to the same or analogous elements.

DETAILED DESCRIPTION OF THE PREFERRED EMBODIMENT

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

A new method is here proposed to produce thin substrates of a material. A method is provided for producing a thin substrate with a thickness below 750 microns. The method comprises: providing a mother substrate, the mother substrate having a main surface and a toughness; inducing a stress with a predetermined stress profile in at least a portion of the mother substrate, the portion comprising the thin substrate, the induced stress being locally larger than the toughness of the mother substrate at a first depth under the main surface of the mother substrate, such that the thin substrate is released from the mother substrate at the first depth, wherein the toughness of the mother substrate at the first depth is not lowered prior to inducing the stress.

With the toughness of the mother substrate not being lowered prior to inducing stress is meant that no measures are taken intentionally to facilitate lift-off of the thin substrate from the mother substrate. In other words, no weakening layers are provided at the location where the thin substrate has to be released from the mother substrate.

The principle of the method according to preferred embodiments is as follows. A stress field with a predetermined stress profile (predetermined in value as well as in orientation) is applied to a mother substrate. This stress locally exceeds the toughness of the material at a first depth and will therefore induce a crack at that location. Once the crack is initiated, it can propagate into the mother substrate. As a result of the crack, some material is released (first locally) from the mother substrate, leading to a modification of the stress distribution over the mother substrate. The change in stress distribution (and in particular orientation) may trigger a change in the direction of propagation of the crack. The stress distribution is indeed applied such that the direction of crack propagation converges towards a direction parallel to the main surface of the mother substrate. Whatever the initial orientation of the first crack initiation, the crack propagates parallel to the main surface of the mother substrate, and the thin substrate that is released from the mother substrate has a relatively homogeneous thickness (within a few percents).

The depth in the mother substrate at which a crack will be formed or initiated or, in other words, the depth in the mother substrate at which the thin substrate will be released, may be determined by tuning properties and/or dimensions of a stress inducing mechanism. According to preferred embodiments, the stress inducing mechanism may be formed by a roller which is bonded to the main surface of the mother substrate. In this case, tuning the properties and/or dimensions of the stress inducing mechanism may comprise tuning properties and/or dimensions of the roller (see further).

According to other preferred embodiments, the stress inducing mechanism may be formed by: providing a set of at least one layer of stress induction material with a set of at least one predetermined stress induction mechanism on the mother substrate, and actuating the set of at least one stress induction mechanism.

According to these embodiments, tuning properties and/or dimensions of the stress inducing mechanism may comprise tuning properties and/or dimensions of the stress induction material.

Where in the description and claims the terms stress induction material and stress induction mechanism are used, a material and a mechanism are meant which are, when not driven or actuated, not inducing stress but, when being driven or actuated, can induce stress or have the ability of inducing stress. Where, in the description and the claims, the terms stress inducing material and stress inducing mechanism are used, a material and mechanism are meant which are driven and thus induce stress.

FIG. 1 illustrates subsequent steps in the method according to a first preferred embodiment. In a first step, a layer of stress induction material (2) is provided on a main surface of a mother substrate (1), e.g. silicon (see FIG. 1(a)), the layer of stress induction material (2) showing a good bonding to the mother substrate (1). It has to be understood that this example is not intended to limit the preferred embodiments and that the preferred embodiments also apply for a plurality of layers of stress induction material. In a next step, a suitable stress induction mechanism may be actuated or driven for inducing stress in at least a portion of the mother substrate (1) (see FIG. 1(b)). As a result of the induced stress the layer (2) of stress induction material tends to detach from the mother substrate (1), e.g. silicon. While detaching, because of the good adhesion or bonding of the layer (2) of stress induction material, e.g. metal layer, to the mother substrate (1), e.g. silicon substrate, the layer (2) of stress induction material rips off part of the mother substrate (1), e.g. silicon, to form a thin substrate (3) from the underlying mother substrate (1) (see FIG. 1 (c)). Because of the remaining mechanical stress, the released subsystem comprising the layer (2) and the thin substrate (3) may be rolled-up (see FIG. 1 (d)). At least partially removing the layer (2) of stress inducing material (see FIG. 1 (e)) releases the stress and unrolls the thin substrate 3, leaving a flat and thin, e.g. below 750 μm thick, ripped-off thin substrate (3), e.g. thin silicon substrate (see FIG. 1 (f)).

Figure 2B:
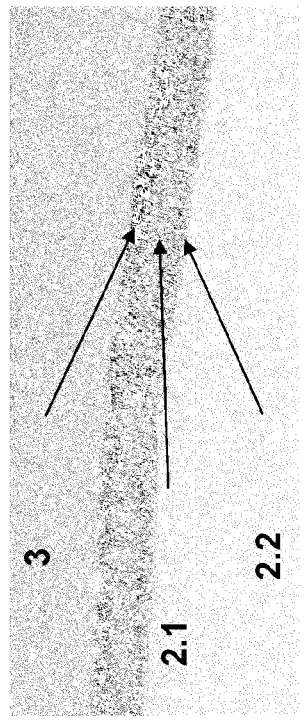
FIG. 2a shows a picture of a thin silicon substrate released from a multi-crystalline wafer and FIG. 2b is a microscope picture of a cross-section of a rolled stack.
Figure 2A:
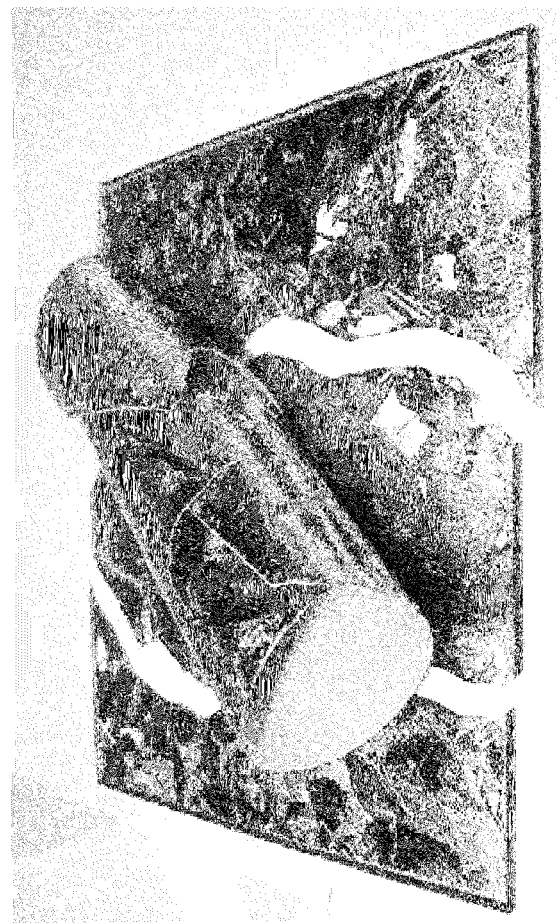

FIG. 2a shows a picture of a thin silicon substrate released from a multi-crystalline wafer by using the method according to preferred embodiments. FIG. 2b is a microscope picture of a cross-section of the rolled-up sub-system in case of the use of a set of two layers of stress induction material, showing a thin silicon substrate (3) and a bilayer stack of an Ag sub-layer (2.1) and an Al sub-layer (2.2).

FIG. 3a shows a picture of a thin silicon substrate after removal of the at least one layer of stress induction material, e.g. by metal etching. FIG. 3b shows a microscope picture of the cross-section of the cleaned thin substrate. The first main surface (32) of the formed thin substrate (3), which was in physical contact with the remainder of the mother substrate (1), shows a rather shiny aspect. The opposite surface, surface (31), of the formed thin substrate (3) which was in physical contact with the at least one layer (2) of stress induction material, shows a rougher, textured aspect.

It is believed that other materials can be used, such as other semiconductors, other crystals, but also other bulk materials.

Hereinafter, an example of a suitable stress inducing mechanism for inducing stress in at least a portion of the mother substrate (1) will be described.

In order to obtain a desired stress distribution or stress profile a set of at least one layer (2) of materials able to induce stress in the mother substrate (1) is provided onto the mother substrate (1). This may, for example, be done by screen-printing the at least one layer (2) on the parent or mother substrate (1), which may, for example, be a 300-μm-thick Cz wafer). In the example given, the stress induction material may be a material with a thermal expansion coefficient different from the thermal expansion coefficient of the mother substrate (1). According to the present example, the stress inducing mechanism may then be the difference in thermal expansion coefficient (TCE) between the at least one printed layer (2) and the mother substrate (1), in the example given silicon.

In the example given, the at least one layer (2) of stress induction material was bonded to the mother substrate (1) at high temperature (~800° C.) in a belt furnace. During cooling down, the difference in TCE induces stress in the system. When the stress locally exceeds the toughness of the mother substrate (1), e.g. silicon, a crack is initiated, hereby locally releasing from the mother substrate (1) a sub-system composed of the set of the at least one layer (2) of stress inducing material and a portion of the mother substrate (1). In this case, a maximum stress point is formed at the interface between the mother substrate (1), e.g. silicon, and the set of at least one layer (2) of stress inducing material, and the opening mode (perpendicular to the maximum stress direction) exhibits an oblique angle with regard to the main surface of the mother substrate (1).

Figure 5:
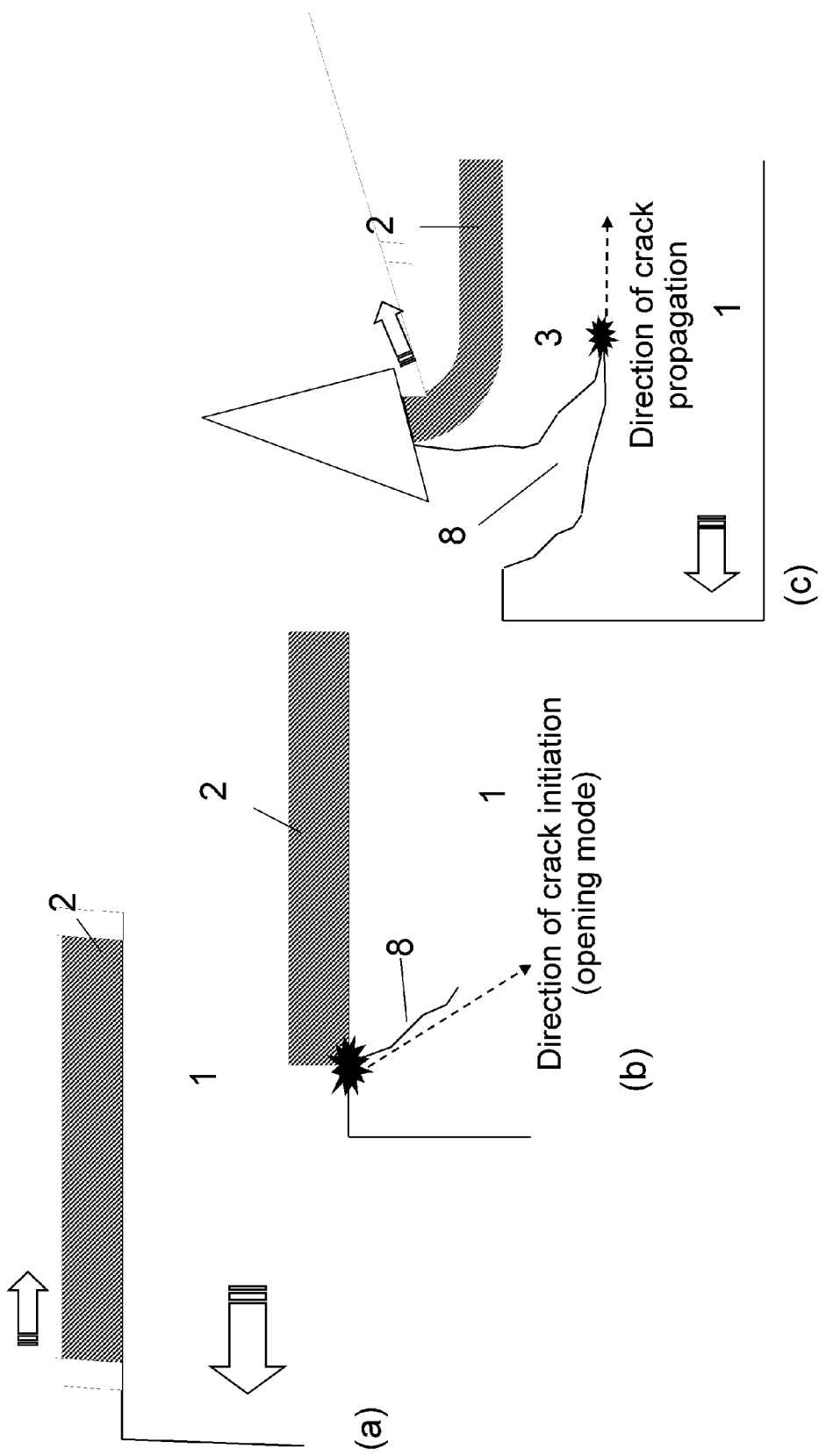
FIG. 5 illustrates the mechanism for crack (8) initiation and the evolution of its direction.

Because the portion released from the mother substrate is bonded to the at least one layer of stress inducing material, the stress is not completely relieved from the subsystem once it is ripped off from the mother substrate (1). The set of at least one layer (2) may be under tensile stress, whereas the piece of mother substrate (1), e.g. silicon, is under compressive stress, or vice versa. This particular local stress distribution leads to the curling of the subsystem, similarly to a bimetal. The curling of the released subsystem continuously changes the stress distribution during the releasing process. This continuous change is such that the crack propagation converges towards a direction parallel to the main surface of the mother substrate (1). FIG. 5 describes the releasing process. FIG. 5 illustrates stress induction (see FIG. 5(a)), crack (8) initiation (see FIG. 5(b)) and the evolution of the direction of the crack (8) (see FIG. 5(c)).

Using a finite-element-analysis modeling tool, the stress distribution triggered by a stress induction material on a mother substrate can be calculated and tuned. As an example, the stress distribution triggered by a 50-μm-thick layer of pure aluminum (stress induction material) on a 300-μm-thick silicon substrate (mother substrate (1)) was calculated. The point of maximum stress is indeed calculated to be at the interface between the silicon (1) and the stress-inducing layer (2), at the edge of the layer stack. Knowing the different stress components (including shear stress), the opening mode was calculated, perpendicular to the direction of principal stress.

Figure 8:
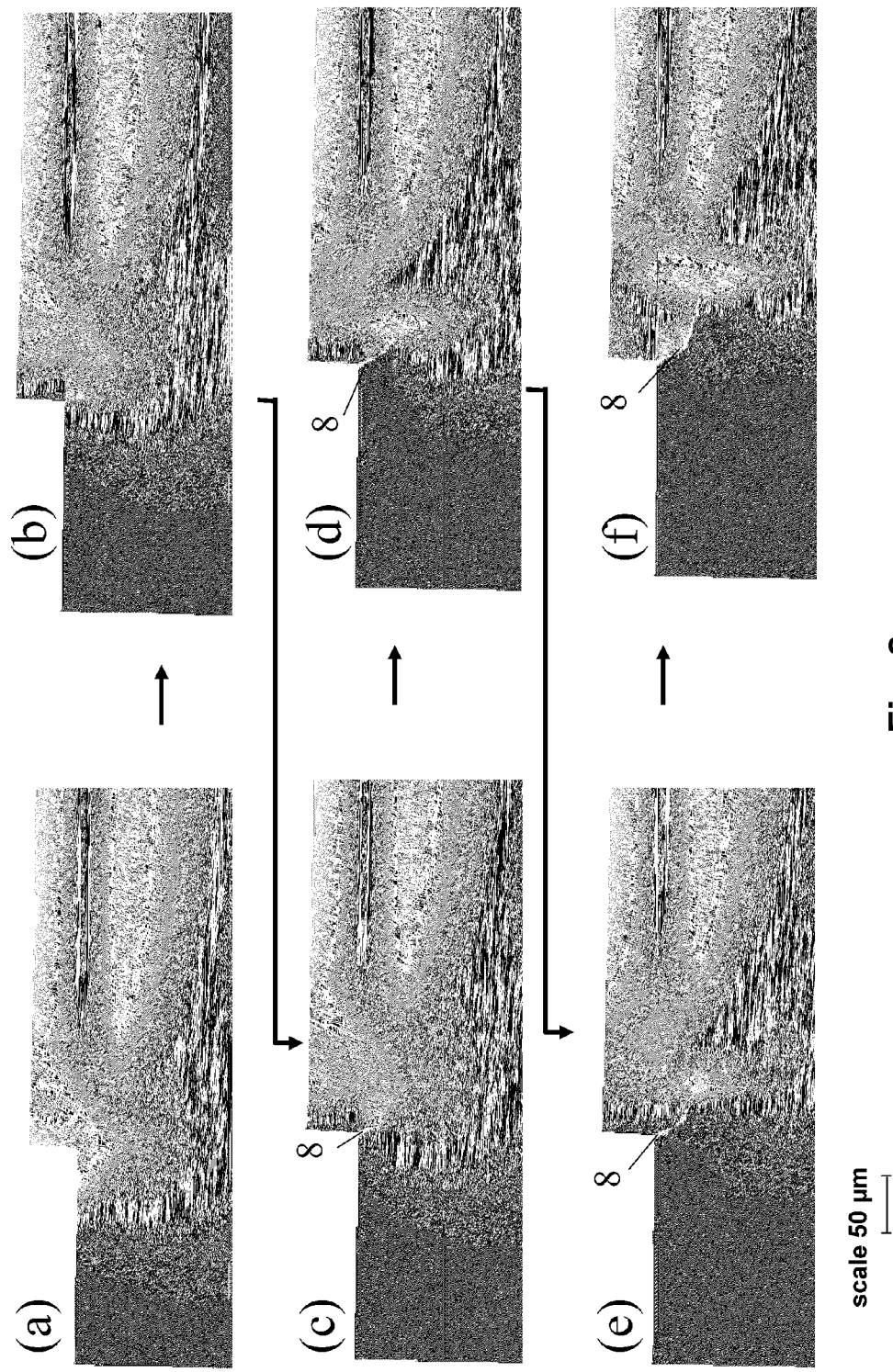
FIG. 8 is a simulation of a change of direction in the crack propagation.

The structure under study was numerically "broken" by redrawing the structure and locally modifying the nodes in order to insert a crack (8) in the direction of the opening mode, over a distance d. The stress distribution was calculated again and it was found that the point of maximum stress was in the latter case at the end of the crack (8). The opening mode was calculated again and the crack (8) was manually propagated, point after point, in the direction each time calculated. The distance d is chosen sufficiently small so that the resulting crack (8) trajectory does not significantly depend on d, and sufficiently large to limit the computation time. The result of the computation is shown in FIG. 8(a) to FIG. 8(f) after 20 points calculated each time. In the example given, d is chosen to be 5 μm. It can be seen from FIG. 8 that the direction of propagation of the crack evolves towards a direction parallel to the main surface (see FIG. 8(f) compared to FIG. 8(c)).

In this case the stress inducing mechanism is a thermal load in combination with the thermal expansion coefficient difference between silicon and the stress-inducing layers. The stress-inducing materials were formed by metal pastes. It has to be understood that, according to other preferred embodiments, the stress induction material may also comprise nonmetallic materials, like for instance polymer materials. For instance, it is possible to use a SU-8 photoresist material which provides also a good adhesion to and a thermal coefficient mismatch with substrate materials like silicon.

According to preferred embodiments, the method may furthermore comprise providing at least one local weakness, for example, a weakened layer, in the mother substrate (1) before inducing the stress in the mother substrate (1). The at least one local weakness may be provided at a second depth, different from the first depth at which release of the thin substrate (3) will occur. Most preferably, the second depth is smaller than the first depth, such that when the thin substrate (3) is released from the mother substrate (1), the at least one local weakness is located in the thin substrate (3). The at least one local weakness can then, for example, be used in further processing of the thin substrate (3), e.g. for thinning down the thin substrate yet further.

In a method according to preferred embodiments, release of the thin substrate (3) occurs at locations different from the location of the at least one local weakness, if provided (see further). Providing at least one local weakness, e.g. a weak layer, and cracking the silicon at a different depth can carry some interest. For example, if the additional "weak" layer is easily removable selectively compared to the material of the mother substrate (1), e.g. silicon (porous Si etches much faster than crystalline Si, Si oxides are etched in HF selectively to Si), then this property of the additional weak layer can be used to easily remove the at least one layer (2) of stress inducing material. The method could, for example, comprise formation of a sacrificial layer, e.g. silicon oxide layer in the mother substrate (1), providing at least one layer of stress induction material, cooling down and peeling-off a stack of thin substrate and stress induction material, removal of the sacrificial layer, e.g. HF-dip to remove (lift-off) the stress-inducing layers at the location of the sacrificial layer, e.g. silicon oxide layer. The provision of the sacrificial layer can help in cleaning and removing of the stress-inducing layers.

Figure 7:
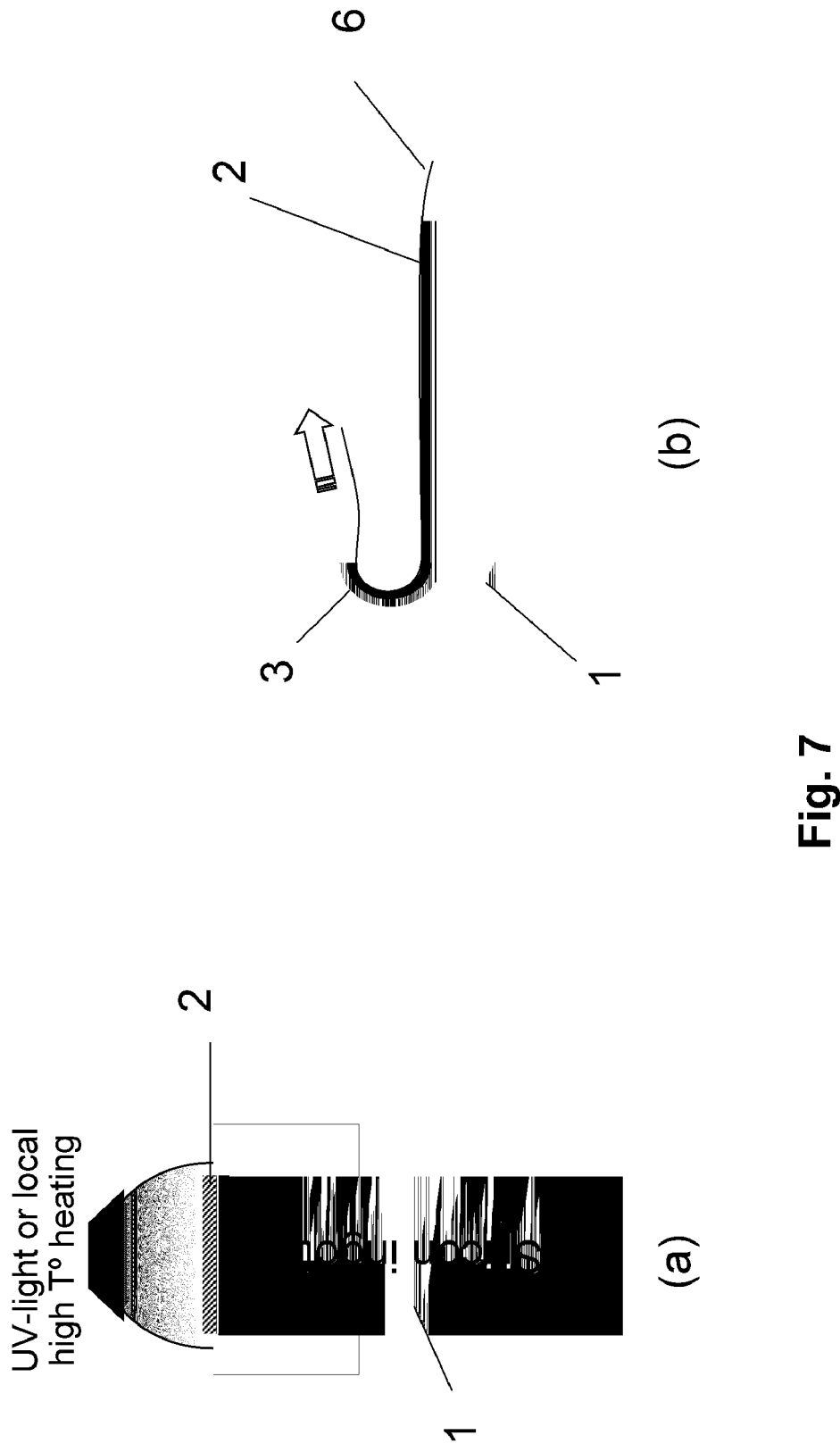
FIG. 7 illustrates the use of the method on an ingot (a), and the use of a flexible film as a stress-inducing mechanism (b).

According to preferred embodiments, the mother substrate (3) may have a cylindrical shape, may have another cross-sectional shape, may be an ingot (see FIG. 7(a)), or the like. The ingot may be used to slice several wafers out of it, by means of a method in accordance with preferred embodiments.

According to preferred embodiments, the method may furthermore comprise temporarily bonding the at least one layer (2) of stress induction materials to a stretchable carrier substrate (6) (illustrated in FIG. 7(b)). The stretchable carrier substrate (6) can be chosen such that it is resistant to the series of stress induction mechanisms, and/or to the induced mechanical stress. The stretchable carrier substrate (6) can be used to externally assist the stress application or induction to release the thin substrate.

Figure 12:
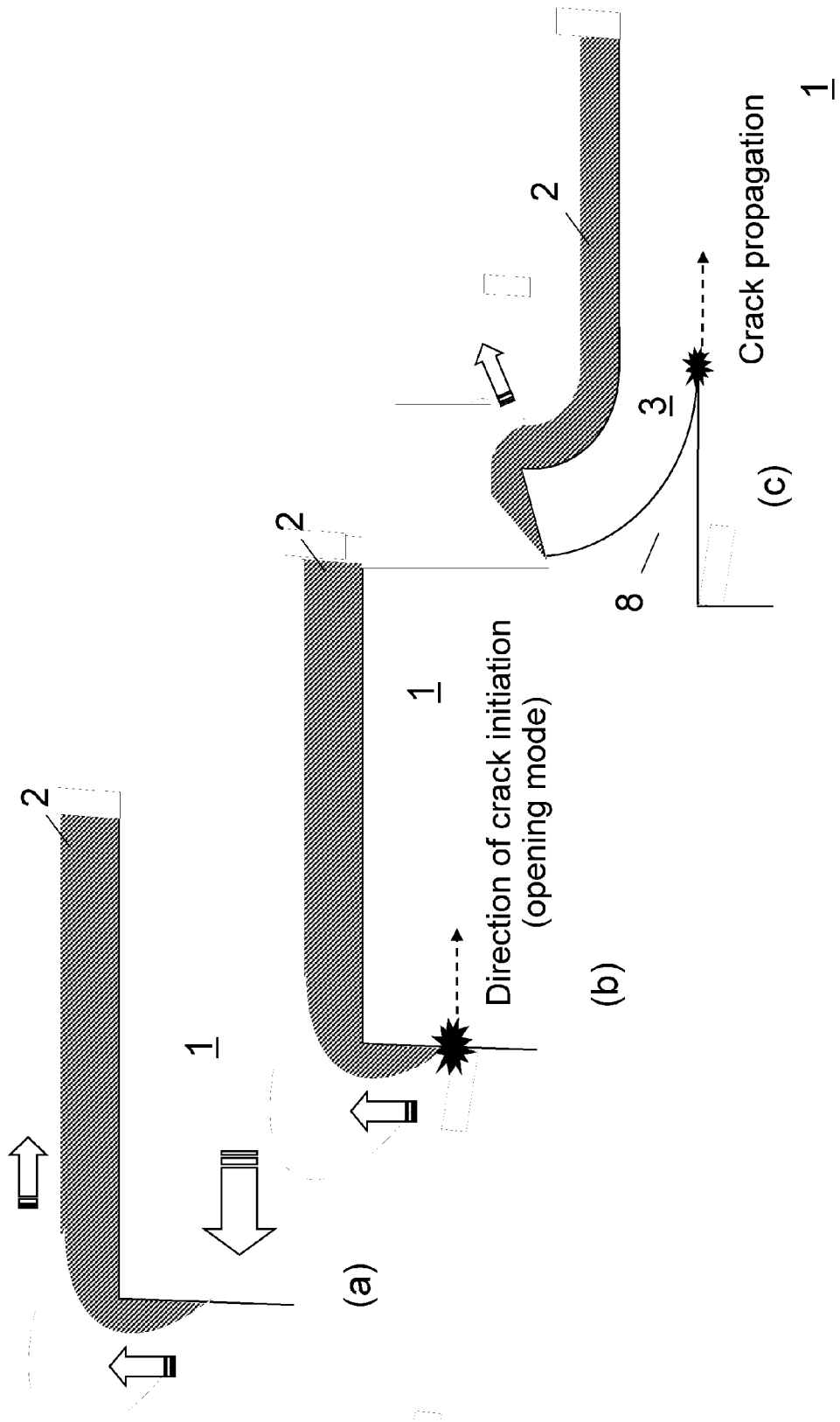
FIG. 12 is an illustration of a preferred embodiments wherein the at least one layer of stress induction materials is partially extending from the side surface of the mother substrate.

According to preferred embodiments, the mother substrate (1) may have a side surface and the at least one layer of stress induction materials may be partially extending on the side surface of the mother substrate (1) (see FIG. 12). According to preferred embodiments, the amount of stress induction material (2) extending over the side surface may determine the thickness of the thin substrate (3) to be ripped off.

Hereinafter, experiments will be described for illustrating that determination of the depth at which the thin substrate (3) is released from the mother substrate (1) can be done by, according to the present embodiment, tuning the properties of the at least one layer (2) of stress induction material.

In a first experiment, wafers of multi-crystalline silicon, p-type, 10×10 cm$^2$, with a thickness of ~300 µm were chosen as mother substrate (1). Saw damage was removed by immersion of the wafers in a warm solution comprising 20% NaOH by mass for 5 minutes and Na ions potentially remaining on the wafers (1) were neutralized by immersion of the wafers (1) in a warm diluted solution of 10% HCl by volume for 10 minutes. On top of the wafers (1), a commercially available Ag paste, e.g. DuPont PV146 was screen-printed. The paste was then dried at 200° C. for a few minutes in a belt dryer and the wafers (1) were then fired at 850° C. for a few seconds. Some bending of the wafers (1) was already visible after the first printing/firing sequence.

The wafers (1) were then divided into two groups. On top of the Ag layer of the first group of wafers (1), a layer of a commercially available Al paste, e.g. DuPont PV333 was screen-printed. The Al paste was dried under similar conditions as described above for the Ag paste, and the wafers (1) were fired in the same belt furnace for a few seconds at very high temperature, such as above 700° C., e.g. around 850° C. On the second group of wafers (1), a second layer of the same Ag paste was screen-printed. The second group of wafers (1) was then also dried and fired under the same conditions as the first one.

During cooling down after the second firing step, wafers (1) from both the first and second group exhibited a large bending, which was even increasing while the wafers further cooled down. At a certain moment, the stress in the wafers (1) was so large that a crack occurred, and the metallic layer (set of two layers of stress-inducing material) was peeled off the wafer of mother substrate (1), ripping-off at the same time a thin layer of silicon (3) from the mother substrate (1). This phenomenon occurred for the two groups of wafers (1).

Figure 13:
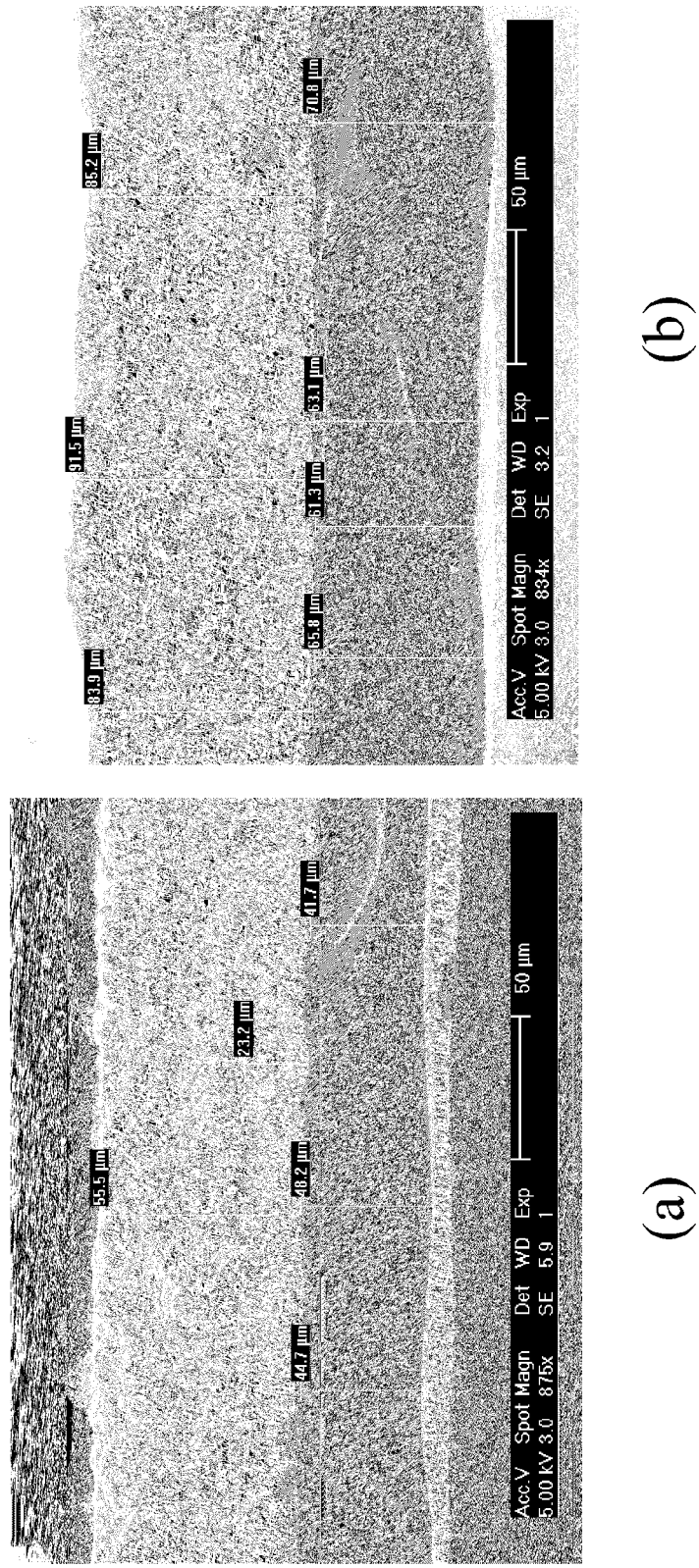
FIG. 13 shows SEM pictures for a released thin substrate with a set of an Ag and an Al layer as stress induction material (FIG. 13a) and for a released thin substrate with a set of two Ag layers as stress induction material (FIG. 13b).

A small part of the multilayer (metal layer+silicon thin layer) of each group was analyzed using SEM (scanning electron microscopy). The SEM photographs are illustrated in FIG. 13a (first group of wafers with Al/Ag layers) and in FIG. 13b (second group of wafers with two Ag layers). These SEM photographs are typical examples of a cross-section of the multilayer formed for both groups. It is clear form the SEM photographs that the thin substrate (3) layer removed from the mother substrate (1) is thicker for the second group with the two Al layers as stress induction material than for the first group having a stack of an Ag and an Al layer as stress induction material. This experiment proves that the fracture surface or location at which lift-off of the thin substrate (3) from the mother substrate (1) occurs, may be determined by the properties (mechanical properties, dimensions) of the stress-induction layers (2).

In a second experiment, a weak plane was provided before inducing stress to the mother substrate (1). The weak plane was such that its toughness is still higher than the induced stress at that second depth. In the experiment, the porosity (volume of substrate material/total volume) of the weak layer was around 40-50%. This experiment shows that even in the presence of a "weak" plane, the fracture or lift-off of the thin substrate (3) occurs preferentially at a depth determined by the properties of the stress-inducing layers and not at the location of the weak plane.

Figure 14:
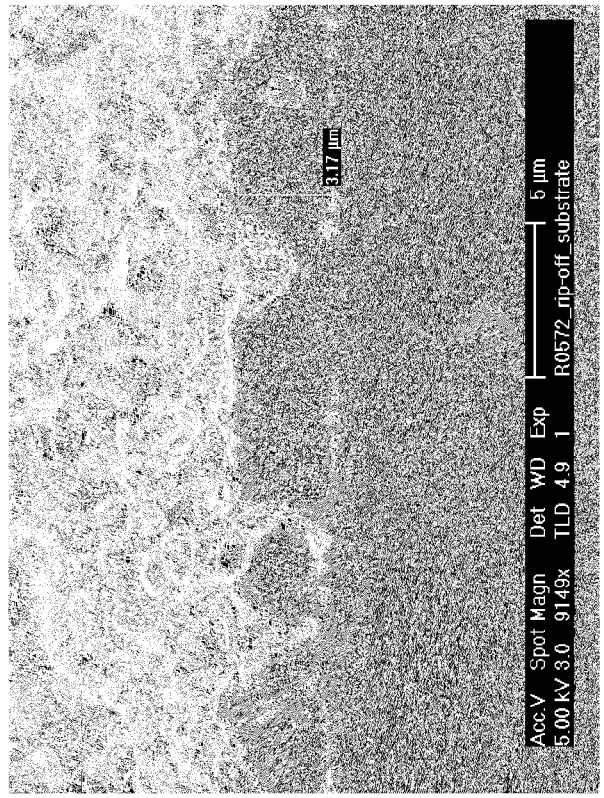
FIG. 14 shows SEM pictures illustrating a crack appearing at a different location than a weak layer.
Figure 14:
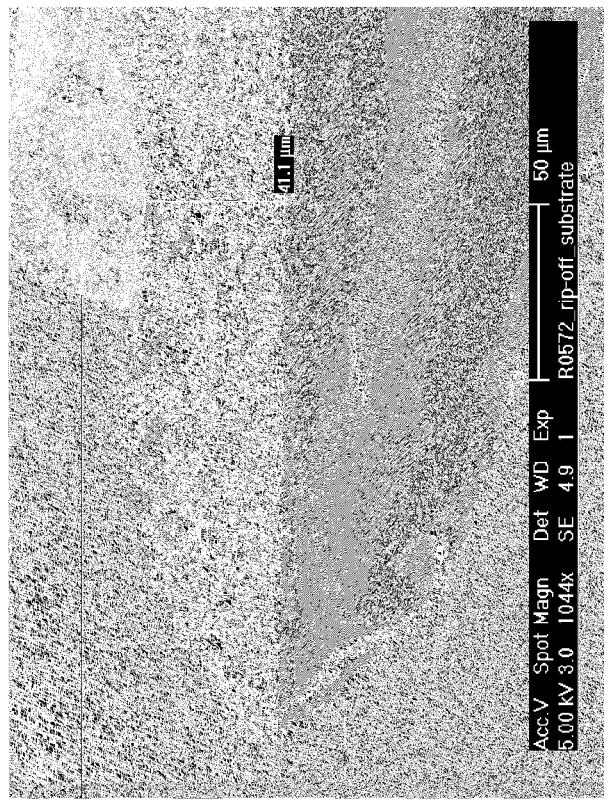

For this experiment a wafer of monocrystalline silicon, n-type, 4×4 cm$^2$, with a thickness of ~600 µm was chosen as the mother substrate (1). First an anodization step was performed, the role of which was to create macro-pores at the surface of the wafer (1). The wafer was then dipped in a bath of HF and ethanol (1:5) for 10 min, then rinsed and dipped in HF 1% for 1 min. Another rinsing step followed before the wafer (1) was dried in air. The wafer (1) was then annealed under Ar atmosphere for 2 h at 1150° C. The purpose of this step was to re-organize the pores so that they formed a surface layer of mono-crystalline material and a macro-porous "weakened" layer just underneath the top layer. The macroporous layer was situated 2 μm below the surface of the mother substrate (1). In the experiment, the top surface was closed, i.e. did not comprise pores, but the voids were not completely gathered. The porous layer was weak (macroporous: full of small cavities), but not very weak (not forming a unique cavity). On top of the wafer (1), a commercially available Ag paste, e.g. DuPont PV146, was screen-printed (stress induction material). The paste was dried at 200° C. for a few minutes in a belt dryer, and the wafer was then fired at 850° C. for a few seconds. No bending was observed this time, which may be attributed to the fact that the mother substrate (1) was a lot thicker than in the previously described experiment. On top of the Ag layer, a layer of a commercially available Al paste, e.g. Chimet Al 7241 SC was screen-printed. The paste was dried under similar conditions and the wafer (1) was fired in the same belt furnace for a few seconds at very high temperature, e.g. above 700° C., such as around 850° C. During cooling down after the second firing step, the induced stress in the wafer was so large that a crack occurred, and the metallic layer was partly peeled off. The result is illustrated in FIG. 14. On the SEM pictures it can be seen that the fracture occurred far deeper than the weak layer. FIG. 14a shows the edge of the crack, showing the fracture surface at a depth larger than 40 μm, despite a weakened layer being present at about 3 μm from the mother substrate surface. FIG. 14b illustrates a zoom on the same sample, showing the weakened layer being formed by small cavities.

It has to be understood that the stress induction mechanisms are not limited to thermally induced shape changes as described above. The stress can also be obtained by applying a change in the environment of a material whose shape is affected by the external conditions. This material can be sensitive to a change of the environment regarding: electrostatic (piezoelectric), magnetostatic (magnetic material), electromagnetic (UV sensitive, for instance), chemical or pressure conditions.

The ambient condition state of the released subsystem is in this case a rolled up composite stack of layers comprising the set of stress inducing materials and the thin silicon substrate. According to preferred embodiments, it can be advantageous to bond the at least one layer (2) of stress induction material to the mother substrate (1) at room temperature (or more generally under standard conditions), to obtain the release by e.g. cooling down the whole system, or selectively heating up the mother substrate (1) from the set of at least one layer (2) of stress induction material (more generally by deviating from standard conditions), so that the released subsystem is only temporarily in a rolled-up state, and recovers its flat shape when standard conditions are applied again.

Figure 9:
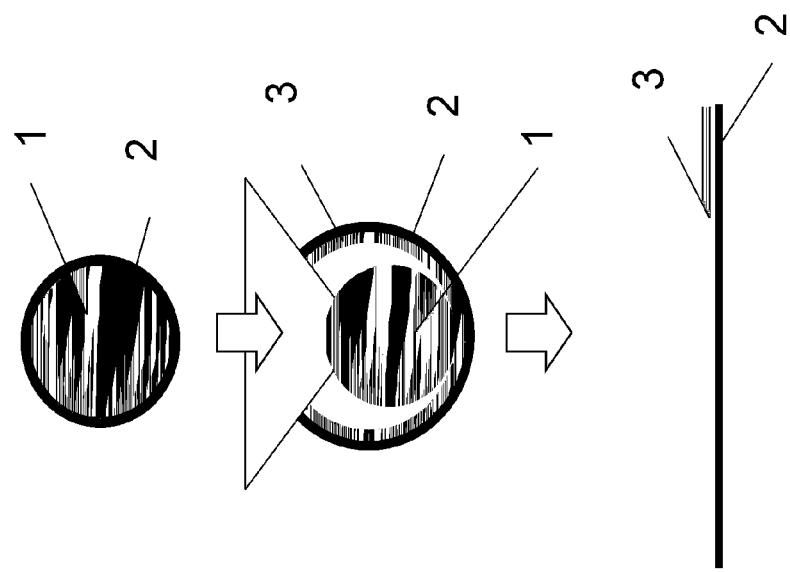
FIG. 9 is a comparison of a method applied on a flat-shaped main surface and a method applied on a cylinder-shaped main surface.
Figure 9:
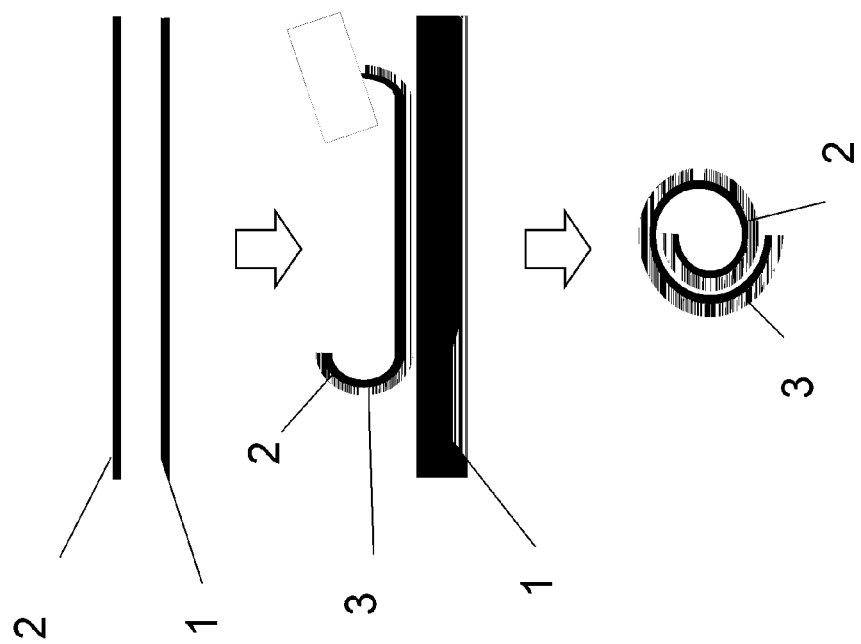

In this case the mother substrate (1) may be a flat wafer but this is not a requirement. The method may also be successfully applied on textured wafers and can also be applied on non-plane surfaces. In particular the mother substrate (1) may be a cylinder-shaped mother substrate where the set of at least one layer of stress induction material is deposited on the outside curled surface. The cylinder curvature can be customized so that the released subsystem is flat under standard processing conditions (room-temperature). This process is compared to the process applied on a flat-shaped substrate in FIG. 9 (originally flat-shaped substrate in the left hand side of FIG. 9, compared to originally cylinder-shaped substrate in the right hand side of FIG. 9). The top part of FIG. 9 illustrates, for both cases of a flat and a cylindrical substrate, a mother substrate (1) provided with at least one layer (2) in non-standard conditions, e.g. at a temperature above 800° C. The middle part shows the process of ripping off the at least one layer (3) together with the thin substrate (3). The bottom part of FIG. 9 illustrates the ripped-off thin substrate (3) on the at least one layer (2), brought back into standard conditions, e.g. room temperature. It can also be interesting to consider a concave substrate since the direction of the stress induced by the at least one layer (2) of stress inducing material may play a role in the release of the thin substrate (3). From FIG. 9 it can be seen that in case of a flat mother substrate (1) a curled thin substrate (3)/stress inducing material (2) sub-system can be obtained (left side of FIG. 9) while, when using a cylinder-shaped mother substrate (1) a flat thin substrate (3)/stress inducing material (2) sub-system can be obtained (right side of FIG. 9).

Preferably, the method may be applied to a mother substrate (1) that can withstand the stress distribution induced during the releasing process without breaking. In this case, the mother substrate (1) can be used several times to produce an important number of thin wafers with only limited material loss.

The method was successfully applied on a multi-crystalline substrate (grain size in the order of 1 cm). This means that the macroscopic propagation of the crack is independent of the crystal planes.

Figure 10:
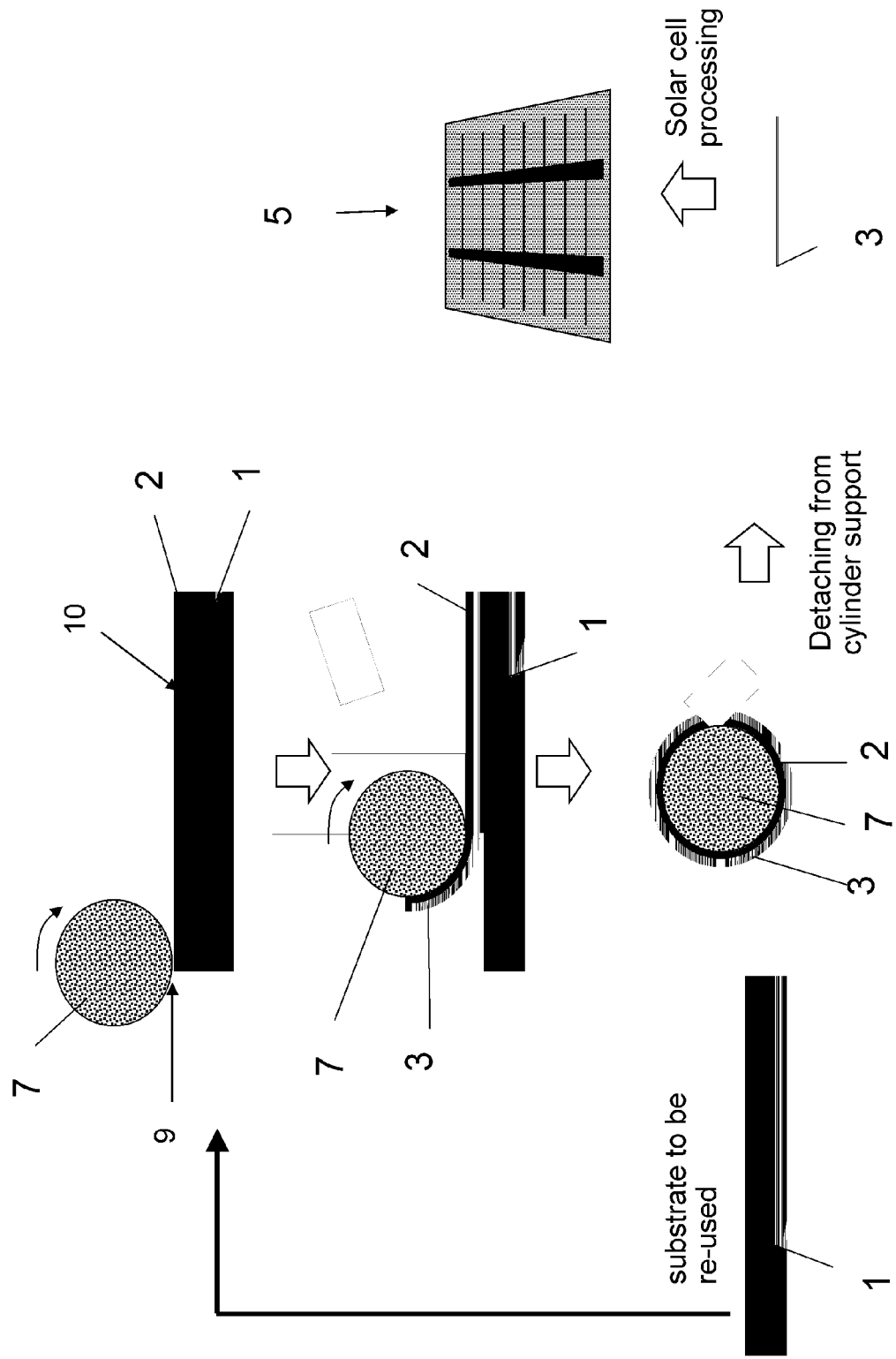
FIG. 10 shows a method to obtain a thin substrate without necessarily depositing a stress-inducing layer.

According to further preferred embodiments, deposition of at least one layer of stress induction material is not a requirement. According to these embodiments, the stress inducing mechanism may be formed by a cylinder-shaped apparatus, e.g. roller (7), which is bonded to the main surface of the mother substrate (1), as illustrated in FIG. 10. Tuning the properties and/or dimensions of the stress inducing mechanism may, according to these embodiments, be performed by tuning the properties and/or dimensions of the cylinder-shaped apparatus, e.g. roller (7). A good bonding 9, i.e. a bonding which is strong enough to withstand the induced mechanical stress, of the mother substrate (1) to the cylinder-shaped apparatus, e.g. roller (7), is able to induce a stress distribution compatible with the releasing of a thin substrate (3). Depositing an optional bonding agent 10 on top of the mother substrate (1) can in this case help applying the stress distribution with the cylinder-shaped apparatus, e.g. roller (7), without breaking the thin substrate (3). This method is schematically illustrated in FIG. 10. Hereby, a rolling movement of a roller (7), which is bonded to the main surface of the mother substrate (1) by means of a bonding agent 10, causes the rip-off of a thin substrate (3). This method can be combined with other methods according to the preferred embodiments. It can for instance be combined with a set of at least one layer (2) of stress induction material which can be actuated or driven by a set of at least one stress induction mechanism, which can be actuated contemporarily with the rolling movement of the roller (7). The different actuation or stress inducing mechanisms can also be applied before the movement of the roller (7), but up until a level which may not suffice to rip-off a thin substrate (3). The bonding agent 10 can be for instance SU-8 polymer.

The bonding agent 10 can be applied on the roller (7), or on the main surface of the mother substrate (1), or on both.

The dimensions of the roller (7) are preferably such that a ripped-off thin substrate (3) does not cover a complete circumference of the roller (7), hereby avoiding self-overlap of the thin substrate (3).

After being released from the mother substrate (1), the thin substrate (3), e.g. thin silicon substrate, in preferred embodiments, is still bonded to the set of at least one stress inducing material. The released subsystem may thus be a rolled-up stack comprising the thin substrate (3) and the at least one layer (2) of stress inducing material. This subsystem can be as large as the mother substrate main surface. Square thin substrates rolled-up of 100 cm² have been obtained. The set of at least one layer (2) of stress inducing material may be removed by e.g. chemical etching. By removing the at least one layer (2) of stress inducing material the stress is relieved from the thin substrate (3) and the thin substrate (3) is then flat and stress-free.

In a specific example as described above, a double layer comprising a screen-printed fire-annealed (over 800° C., for a few seconds) layer of commercially available Ag paste directly on a Si substrate, and on top of that, a screen-printed fire-annealed (over 800° C., for a few seconds) layer of commercially available Al paste is used as a set of two layers (2) of stress induction material. In order to remove the Ag/Al layers (2) after releasing from the mother substrate (2), the subsystem may be dipped subsequently in a warm HCl solution, and in a mixture of HCl and $HNO_3$.

Free-standing contamination-free (checked with TXRF) thin silicon substrates up to 10 cm² have been obtained, with a thickness of 50 μm+/−10 μm. FIG. 3a shows an example of a stress-free silicon thin layer (3) after removal of the layers of stress inducing material by etching. In FIG. 3b a SEM cross-section of the thin silicon substrate (3) is shown. The thickness of the thin substrate (3) is approximately 50 μm. There is no a priori limitation in size or in thickness of the thin substrates (3) that can be produced with the method according to preferred embodiments.

If the resulting subsystem is flat under standard conditions of processing (most of the time room temperature), the set of at least one layer (2) of stress inducing material can be used as a support for the thin substrate (3) and the subsystem can be further processed as it is.

If the set of at least one layer (2) is conductive and makes a good electrical contact with the thin substrate (3), it can be used as one of the electrical contacts of the device.

According to preferred embodiments, it can be advantageous to first deposit a bottom layer of material that is not able to induce stress when driven or actuated and is not etched in a chemical solution used to remove the at least one layer (2) of stress induction material. This layer can be used as electrical contact and/or support layer for handling the thin substrate (3), e.g. thin layer of silicon, after removing the set of at least one layer (2) of stress induction material. If this bottom or support layer is transparent, a back-contact process can be applied and the bottom or support layer can be used as a front surface of the processed solar cell. The same holds also for a layer of stress inducing material which is partly removed to relieve mostly the stress and allow further processing, but which is not completely removed to use the remaining part as a supporting layer or substrate and/or electrical contact.

The rolled-up shape of the thin substrate (3) can be advantageously used in specific applications for example at the focal point of a parabolic mirror. In this case the metal stress-inducing layers can provide electrical contact.

A double layer of e.g. Ag and Al metal pastes has been used in the example described. The process was also successfully applied with a double layer of Ag paste. Also one layer of an optimized material with predetermined or tailored mechanical characteristics can be used to obtain the same result.

Figure 11:
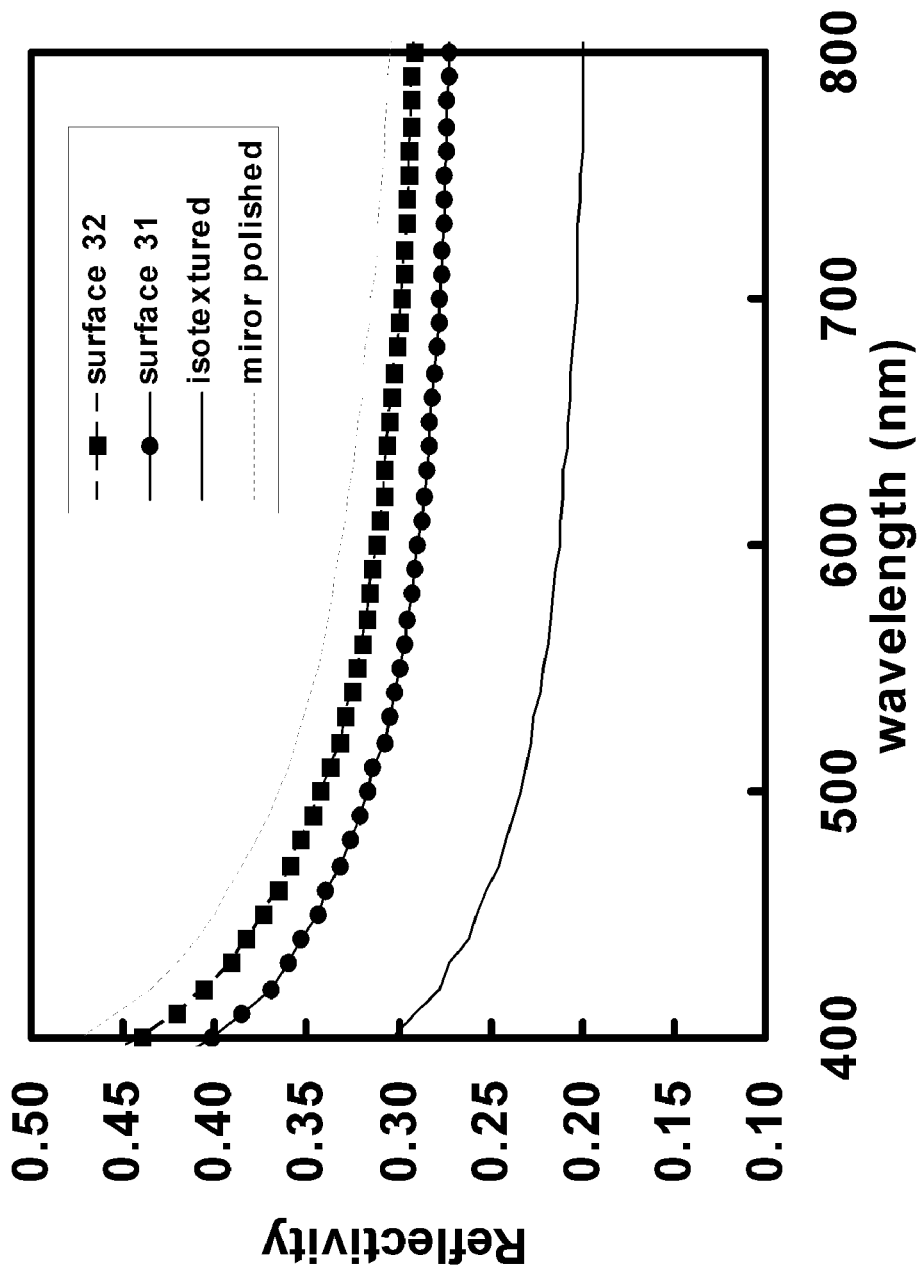
FIG. 11 shows reflectivity spectra of both main surfaces of a thin substrate obtained by a method of a preferred embodiment, compared to the reflectivity of mirror-polished and chemically isotextured substrates.

After etching the at least one layer (2) of stress inducing material, the two main surfaces of the thin substrate (3) have a different aspect. As already discussed before, in FIGS. 3a and 3b, a first main surface (32) of the thin substrate (3) which was in physical contact with the remainder of the mother substrate (1), shows a rather shiny aspect. The opposite surface, surface (31), of the thin substrate (3) which was in physical contact with the at least one layer (2) of stress inducing material, shows a textured aspect. In FIG. 11 the reflectivity spectra of surface (31) (curve A) and surface (32) (curve B) after removal of the stress inducing material is shown. For comparison, on the same graph the reflectivity spectra of a mirror-polished silicon wafer (curve C) as well as of an acidic-textured (isotextured) wafer (curve D) are shown. The spectra of the thin silicon substrate (3) lie between the two references, showing that the texturing resulting from the process traps some light into the thin substrate (3) and can be advantageously used on the front side for, for example, photovoltaic applications. Surface (31) traps more light than surface (32). For surface (32) the roughness is believed to arise from stress distribution during the release and/or preferential plane fracture. The plane can be chosen to tune the roughness according to the required application, i.e. as rough as possible for better light trapping if this surface is used as a front side of a solar cell, as smooth as possible for easier surface passivation if it is used as the rear surface of a solar cell. For surface (31) the roughness is believed to arise from the different chemical treatment that was used for removing the at least one layer (2) of stress inducing material, metal-silicon alloying and/or chemical etching of the metals.

The thin substrate (3), e.g. thin substrate of silicon, produced by the method according to preferred embodiments, can be used to fabricate a solar cell. The thin substrate (3) is cleaned in a mixture of HCl and $H_2O_2$, then in a mixture of $H_2O_2$ and $H_2SO_4$, and finally shortly dipped in HF to remove the oxide formed in the previous steps. From these clean samples, several processes can be applied:

Simple diffusion process: deposition of a P-rich oxide, P-diffusion at high temperature (above 800° C.), metal evaporation for front (with a shadow mask) and back contacts, annealing of the contacts, $ZnS/MgF_2$ anti-reflection-coating (ARC) deposition, edge saw dicing. The result of the best cell obtained so far with this very simple cell process is given in table 2.

Figure 4:
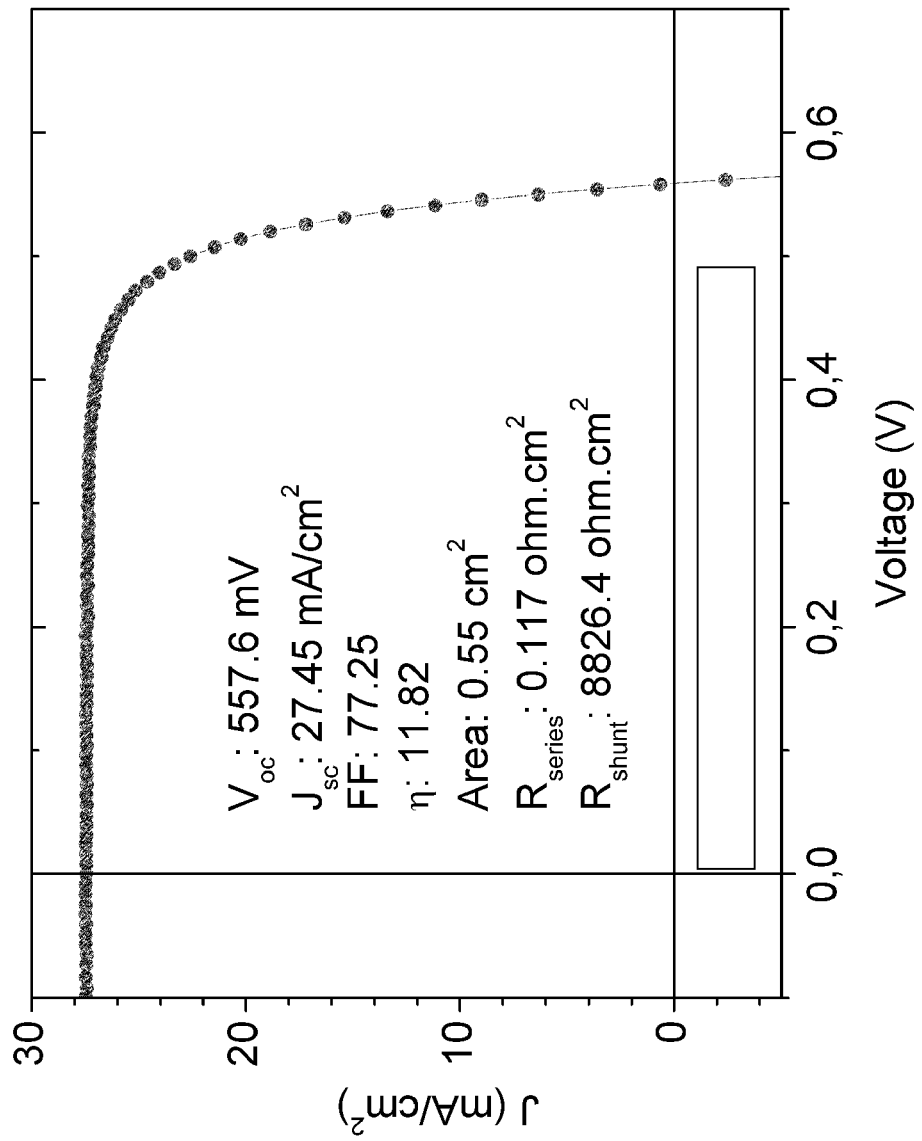
FIG. 4 is a plot representing a measured current-Voltage (IV) characteristic for a photovoltaic cell which is processed on a released or ripped-off thin substrate.

Free-standing Monocrystalline Silicon (FMS) process: deposition of a SiNx layer serving for passivation as well as for ARC, lithography to define the front contact, metal evaporation, metal lift-off, evaporation of the rear contact, annealing, edge saw dicing. The details of this process are presented in 'H. Kim et al., "Progress in thin film free-standing monocrystalline silicon solar cells", Thin Solid Films, Elsevier, 2005'. The result of the best cell obtained so far with this cell process is given in table 2 and FIG. 4.

HIT emitter process: deposition of an n+-doped amorphous silicon layer, deposition of a conductive oxide layer serving as well as an ARC, evaporation of front and back contact with subsequent annealing, edge saw dicing. The details of this process are presented in 'L. Camel et al. "Perspectives for a-Si/c-Si Heterojunction Solar Cells with p or n Type Base" $31^{st}$ IEEE PVSC, pp. 1157-1160 (2005)'.

The result of the best cell obtained so far with this cell process is given in Table 2.

TABLE 2

| Process | Area (cm2) | Jsc (mA · cm−2) | Voc (mV) | FF (%) | Efficiency (%) |
|---|---|---|---|---|---|
| Simple diffusion | 0.73 | 21.79 | 552.3 | 59.0 | 7.10 |
| FMS process | 0.55 | 27.45 | 557.6 | 77.25 | 11.82 |
| HIT emitter process | 1.00 | 26.69 | 549.9 | 67.82 | 9.95 |

Figure 6:
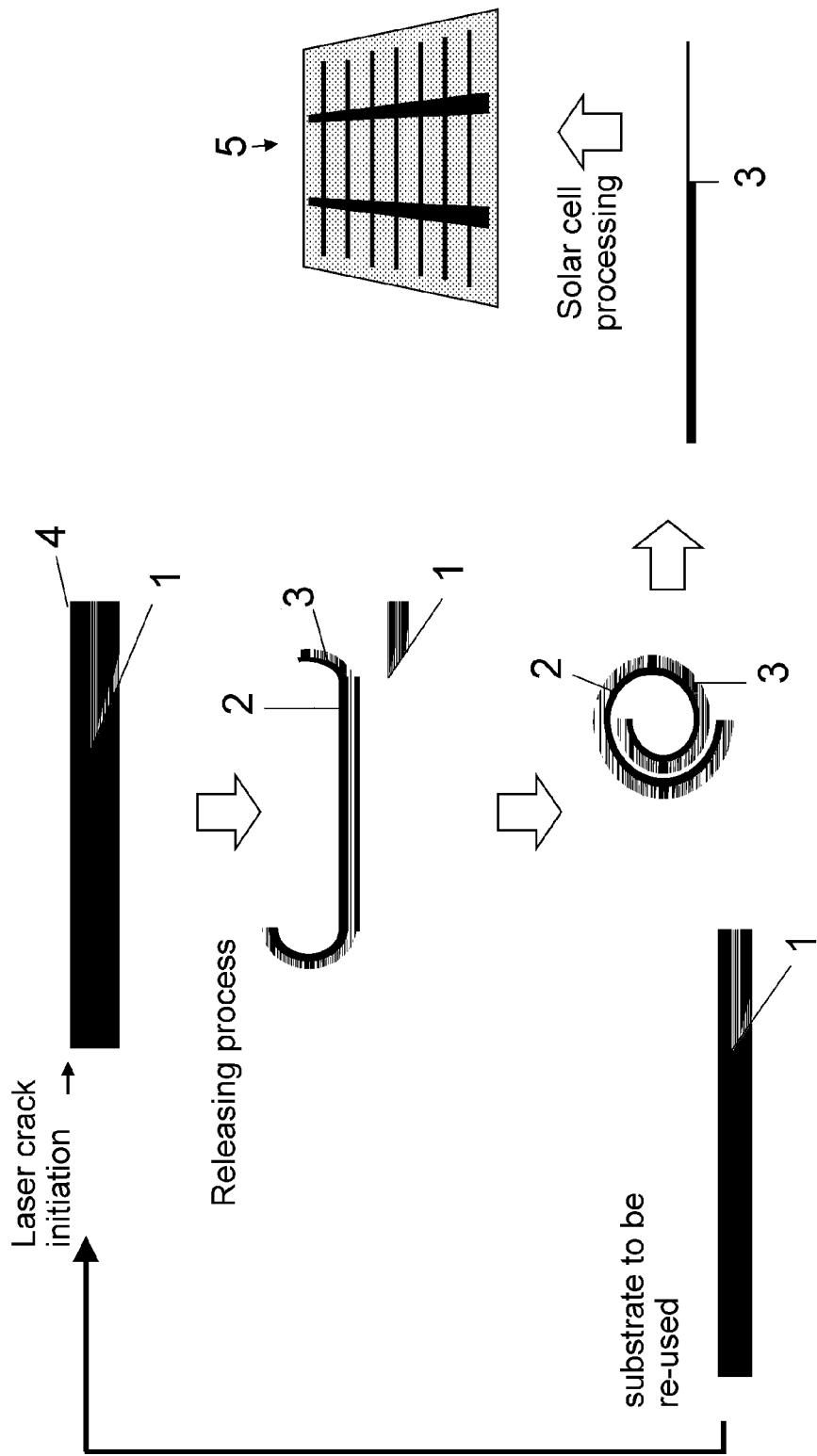
FIG. 6 illustrates a method according to a preferred embodiment.

FIG. 6 illustrates another aspect of the preferred embodiments. A mother substrate 1 is provided, the mother substrate having a weakened layer as described above, or at least a weakened region 4, as for example a laser crack. Onto the mother substrate 1 at least one layer of stress induction material 2 is provided. During the releasing process, i.e. the process to release the thin substrate 3 from the mother substrate 1, the at least one layer of stress induction material 2 is actuated. The actuation may be a thermal actuation. This way, stress may be induced in the mother substrate 1 by creating a different expansion or contraction of the at least one layer of stress induction material 2 and the mother substrate 1. The thin substrate 3 together with the at least one layer of stress induction material 2 may be ripped off from the mother substrate 1 as in the above-described aspects. The at least one layer of stress induction material 2 may be removed from the thin substrate 3, e.g. by chemical etching, so as to release the thin substrate 3. This thin substrate 3 may then be used in further processing, e.g. in solar cell processing, so as to form solar cells. The remainder of the mother substrate 1 may be used for further ripping off of thin substrates 3, optionally after cleaning and/or polishing. Details of the processing of this aspect of the preferred embodiments is as described above with respect to other aspects, except that a weakened layer or weakened region may be provided, and this in combination with at least one thermally actuated stress-induction layer.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for producing a thin layer of silicon, comprising:
    screen printing a metal layer atop a silicon mother substrate;
    annealing the silicon mother substrate and the metal layer at a temperature above 700° C.; and
    at least partially cooling the metal layer, whereby the metal layer undergoes a thermal contraction, leading to a high stress field in the silicon mother substrate due to a mismatch in a coefficient of thermal expansion between the metal layer and the silicon mother substrate, causing the metal layer to peel off the silicon mother substrate with a thin layer of silicon from the silicon mother substrate attached thereto.

2. The method of claim 1, wherein a thickness of the mother substrate is less than 300 μm and wherein a thickness of the thin layer of silicon is from 10 μm to 100 μm.

3. The method of claim 1, wherein the metal is Ag or Al.

4. The method of claim 1, wherein the silicon mother substrate is p-type multi-crystalline silicon, and wherein the silicon mother substrate and the metal layer are annealed at a temperature above 700° C. for a few seconds.

5. The method of claim 1, further comprising repeating the steps of screen printing, annealing, and cooling.

6. The method of claim 1, further comprising temporarily bonding the metal layer to a stretchable carrier substrate.

7. The method of claim 1, wherein the thin layer of silicon has an area up to 10 cm$^2$ and a thickness of 50 μm+/−10 μm.

8. The method of claim 1, wherein a mismatch between a thermal expansion coefficient of the silicon mother substrate and the metal layer is larger than $15\times10^{-6}K^{-1}$.

9. The method of claim 1, wherein the metal layer and the silicon mother substrate are both cooled.

10. The method of claim 1, wherein the silicon mother substrate is amorphous.

11. The method of claim 1, wherein the silicon mother substrate has a crystalline structure selected from the group consisting of nano-crystalline, micro-crystalline, polycrystalline, multi-crystalline, and mono-crystalline.

12. The method of claim 1, wherein the silicon mother substrate is flat.

13. The method of claim 1, wherein a surface of the silicon mother substrate upon which the metal layer is screen printed is convex or concave.

14. The method of claim 1, wherein a surface of the silicon mother substrate upon which the metal layer is screen printed is texturized.

15. The method of claim 1, further comprising bending or elastically deforming the silicon mother substrate to assist in release of the thin layer of silicon.

16. The method of claim 1, further comprising providing a local weakness in the silicon mother substrate, wherein the weakness is a weak layer selected from the group consisting of porous silicon and silicon oxide.

17. The method of claim 1, wherein the metal layer comprises a double layer of Ag or Al metal paste.

18. The method of claim 1, further comprising:
    cleaning the thin layer of silicon in a mixture of HCl and $H_2O_2$; thereafter
    cleaning the thin layer of silicon in a mixture of $H_2O_2$ and $H_2SO_4$; and thereafter
    dipping the thin layer of silicon in HF to remove oxide formed in the cleaning previous steps.

19. The method of claim 1, further comprising depositing a bottom layer of material atop the silicon mother substrate before screen printing the metal layer, and removing the metal layer from the thin layer of silicon to yield the thin layer of silicon atop the bottom layer, wherein the bottom layer is an electrical contact or a support layer for the thin layer of silicon after the metal layer is removed.

20. The method of claim 19, wherein the bottom layer is transparent, and comprises a front surface of a processed solar cell.

21. The method of claim 1, wherein a thickness of the thin layer of silicon is above 100 μm and below 750 μm.

22. A method for producing a thin layer of silicon, consisting of:
 applying a metal paste atop a silicon mother substrate by screen printing;
 drying the metal paste at 200° C. for a few minutes;
 firing the dried metal paste at a temperature above 700° C. for a few seconds, whereby a metal layer is obtained; and
 at least partially cooling the metal layer, whereby the metal layer undergoes a thermal contraction, leading to a high stress field in the silicon mother substrate due to a mismatch in a coefficient of thermal expansion between the metal layer and the silicon mother substrate, causing the metal layer to peel off the silicon mother substrate with a thin layer of silicon from the silicon mother substrate attached thereto.

23. A method for producing a thin layer of silicon, comprising:
 screen printing an Ag layer atop a silicon mother substrate;
 annealing the silicon mother substrate and the Ag layer at a temperature of over 800° C. for a few seconds;
 screen printing an Al layer atop the Ag layer;
 annealing the Al layer at a temperature of over 800° C. for a few seconds; and
 at least partially cooling the metal layer, whereby the Ag and Al layers undergo a thermal contraction, leading to a high stress field in the silicon mother substrate due to a mismatch in a coefficient of thermal expansion between the Ag and Al layers and the silicon mother substrate, causing the Ag and Al layers to peel off the silicon mother substrate with a thin layer of silicon from the silicon mother substrate attached thereto.

24. The method of claim 23, further comprising removing the Ag and Al layers from the thin layer of silicon by dipping in a warm HCl solution and thereafter in a mixture of HCl and $HNO_3$.

25. The method of claim 19, wherein the bottom layer is transparent and is configured to function as a front surface of a solar cell, the method further comprising applying a back-contact process to the thin layer of silicon.

26. The method of claim 1, further comprising selecting a plane of an interface between the silicon mother substrate and the metal layer so as to maximize roughness of a surface of the thin layer of silicon, whereby light trapping of the surface is maximized such that the surface is configured to function as a front side of a solar cell.

27. The method of claim 1, further comprising selecting a plane of an interface between the silicon mother substrate and the metal layer so as to minimize roughness of a surface of the thin layer of silicon, whereby passivation of the surface is facilitated such that the surface is configured to function as a rear surface of a solar cell.

28. The method of claim 18, further comprising:
 deposition of a P-rich oxide and P-diffusion at a temperature above 800° C. on the thin layer of silicon;
 metal evaporation with a shadow mask to form front contacts;
 metal evaporation to form back contacts;
 annealing the front contacts and back contacts;
 deposition of a $ZnS/MgF_2$ anti-reflection-coating; and
 edge saw dicing, whereby a solar cell is obtained.

* * * * *